United States Patent
Lim et al.

(10) Patent No.: US 8,289,508 B2
(45) Date of Patent: Oct. 16, 2012

(54) DEFECT DETECTION RECIPE DEFINITION

(75) Inventors: Victor Seng Keong Lim, Singapore (SG); Rachel Yie Fang Wai, Singapore (SG); Fang Hong Gn, Singapore (SG); Liang Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 413 days.

(21) Appl. No.: 12/621,510

(22) Filed: Nov. 19, 2009

(65) Prior Publication Data

US 2011/0116085 A1      May 19, 2011

(51) Int. Cl.
*G01N 21/00* (2006.01)

(52) U.S. Cl. .................. 356/237.5; 356/237.2

(58) Field of Classification Search ..... 356/237.1–237.5
See application file for complete search history.

(56) References Cited

U.S. PATENT DOCUMENTS

| | | | |
|---|---|---|---|
| 6,583,870 B2* | 6/2003 | Noda | 356/237.5 |
| 7,676,077 B2* | 3/2010 | Kulkarni et al. | 382/144 |
| 2002/0006497 A1* | 1/2002 | Noda | 428/156 |
| 2006/0010416 A1* | 1/2006 | Keck et al. | 716/19 |
| 2009/0284733 A1* | 11/2009 | Wallingford et al. | 356/73 |

* cited by examiner

*Primary Examiner* — Michael P Stafira
(74) *Attorney, Agent, or Firm* — Horizon IP Pte Ltd

(57) ABSTRACT

A method of forming a device is disclosed. The method includes providing a substrate and processing a layer of the device on the substrate. The layer is inspected with an inspection tool for defects. The inspection tool is programmed with an inspection recipe determined from studying defects programmed into the layer at known locations.

19 Claims, 29 Drawing Sheets

| Scan Mode | Spectrum Mode | Imaging Mode | Pixel Size | Focus | Segmentation | Threshold Merge (um) | Cel Size | ID | Signal |
|---|---|---|---|---|---|---|---|---|---|
| 1 Mix<br>2 Array<br>3 Random | 1.Broadband<br>2.Mideband<br>3.Deepband<br>4.Blueband<br>5.I line<br>6.G line<br>7.G-H line | 1.Brightfield<br>2.Edge Contrast +<br>3.High Performance Edge<br>4.VB<br>5.VPS<br>6.HFS<br>7.VPS-F<br>8.HFS-F<br>9.VPS-M<br>10.HPS-M<br>11.VPS-C<br>12.HPS-C | 1 200nm<br>2 160nm<br>3 120nm<br>4 90nm<br>5 80nm<br>6 50nm | inspection eye dependent | 0 - 255<br>Defect of Interest (DOI) dependent | > 0 | 5 ~ 15<br>Depends on products | Depends on products/Eye | Different detect carries different signal |

| Spectral Mode | | Focus (um) | Pixel Size (um) | SRAM BK I | SRAM BG I | SRAM BG II | SRAM BG Subtle T2T | SRAM BG Lateral MM | SRAM Nuisance | LOG BG II | LOG BG VI | Ave |
|---|---|---|---|---|---|---|---|---|---|---|---|---|
| G-Line | BF | 0.00 | 0.08 | 1.1 | 1.11 | 2.5 | 2.17 | 0.8 | 1.09 | 1.33 | 1.45 | 1.49 |
| GHI-Line | ECP | -0.15 | 0.08 | 4.02 | 3.07 | 2.55 | 2.41 | 2.5 | 1.71 | 3.11 | 2.75 | 2.92 |
| GHI-Line | VIB | -0.20 | 0.08 | 1.82 | 2.61 | 2.11 | 2.1 | 1.33 | 1.4 | 1.63 | 2 | 1.94 |
| GHI-Line | BF | -0.10 | 0.08 | 3.14 | 3.09 | 2.5 | 2.33 | 1.83 | 1.17 | 3 | 3.1 | 2.71 |
| H-Line | BF | -0.10 | 0.08 | 3.05 | 2.76 | 1.81 | 1.6 | 2.33 | 1.4 | 2 | 1.67 | 2.17 |
| Middleband_DUV | VIB | -0.10 | 0.08 | 1.51 | 1.74 | 1.88 | 1.88 | 2.5 | 2.33 | 2.33 | 2.11 | 1.92 |
| Deepband_DUV | VIB | -0.20 | 0.08 | 0.89 | 1.19 | 2 | 2 | 1.7 | 1.75 | 1.17 | 1.6 | 1.49 |
| Deepband_DUV | BF | -0.10 | 0.08 | 1 | 1.15 | 2.19 | 1.88 | 1.86 | 1.6 | 2 | 2.16 | 1.77 |
| Blueband_DUV | ECP | -0.15 | 0.08 | 1.06 | 1.93 | 2.1 | 1.63 | 1.91 | 1.43 | 2.5 | 3 | 2.02 |
| Blueband_DUV | VIB | -0.20 | 0.08 | 1.12 | 1.26 | 2.23 | 1.43 | 2.11 | 2.29 | 1.78 | 2.7 | 1.80 |
| Blueband_DUV | BF | -0.10 | 0.08 | 1.49 | 1.56 | 2.3 | 2.13 | 2.25 | 2 | 2.5 | 2.25 | 2.07 |
| Broadband_DUV | ECP | -0.15 | 0.08 | 3.9 | 3.8 | 2.82 | 2.7 | 2.67 | 1.83 | 3.37 | 3.5 | 3.25 |
| Broadband_DUV | VIB | -0.20 | 0.08 | 1.75 | 2.05 | 2.13 | 1.5 | 1.86 | 1.86 | 2.43 | 2.2 | 1.99 |
| Broadband_DUV | BF | -0.10 | 0.08 | 2.16 | 2.77 | 2.2 | 2.17 | 2.67 | 2.2 | 2.67 | 3 | 2.52 |

Fig. 11

DEFECT DETECTION RECIPE DEFINITION

CROSS-REFERENCE

This application is concurrently filed with application Ser. No. 12/621,513 entitled "Test Chiplets For Devices", which is herein incorporated by reference for all purposes.

BACKGROUND

In the fabrication process of electronic devices, for instance, integrated circuits (ICs), it is essential to detect defects effectively at an early stage in order to maintain and improve yield rates. As IC feature sizes shrink, subtle defects may become "killer defects" which can result in improper electrical device functions. Hence, high sensitivity recipes need to be developed to capture low-signal but yield limiting defects.

One of the issues for optimizing a defect detection recipe is the existence of a large amount of nuisance defects which affects the efficiency of distinguishing the "killer defects". For example, as the design rule gets more stringent, the main contributors of noise are not only the noise from the patterns, but also those from nuisance defects like hillocks, silicon cones and discolorations which can be significantly larger than the subtle killer defects. In order to suppress nuisance defects and locate killer defects, tremendous efforts and time need to be invested which can affect productivity.

Therefore, challenges for developing a cost-effective defect detection technique exist.

SUMMARY OF THE INVENTION

A method of forming a device is disclosed. The method includes providing a substrate and processing a layer of the device on the substrate. The layer is inspected with an inspection tool for defects. The inspection tool is programmed with an inspection recipe determined from studying defects programmed into the layer at known locations.

In another embodiment, a method of defect inspection is presented. The method includes providing a substrate having defects programmed (programmed defects) at known locations. The substrate is inspected with an inspection tool using an initial inspection recipe. The method also includes studying defect signals from inspecting the substrate and determining a final inspection recipe which suppresses noise signals.

In yet another embodiment, an inspection tool is also disclosed. The inspection tool includes a recipe set up menu and an inspection recipe stored in the inspection tool. The inspection recipe is used to inspect a layer of a device and is defined through the study of defects programmed into the layer at known locations.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 9a shows a programming menu of a inspection system;
FIG. 11 shows an embodiment of a signal study.

DETAILED DESCRIPTION

Embodiments generally relate to devices, for example, semiconductor devices or integrated circuits. More particularly, the devices facilitate defect detection in devices. The ICs can be any type of IC, such as dynamic or static random access memories, signal processors, microcontrollers or system-on-chip (SoC) devices. The devices or ICs can be incorporated into or used with, for example, consumer electronic products, such as computers, cell phones, and personal digital assistants (PDAs).

Figure 1A:
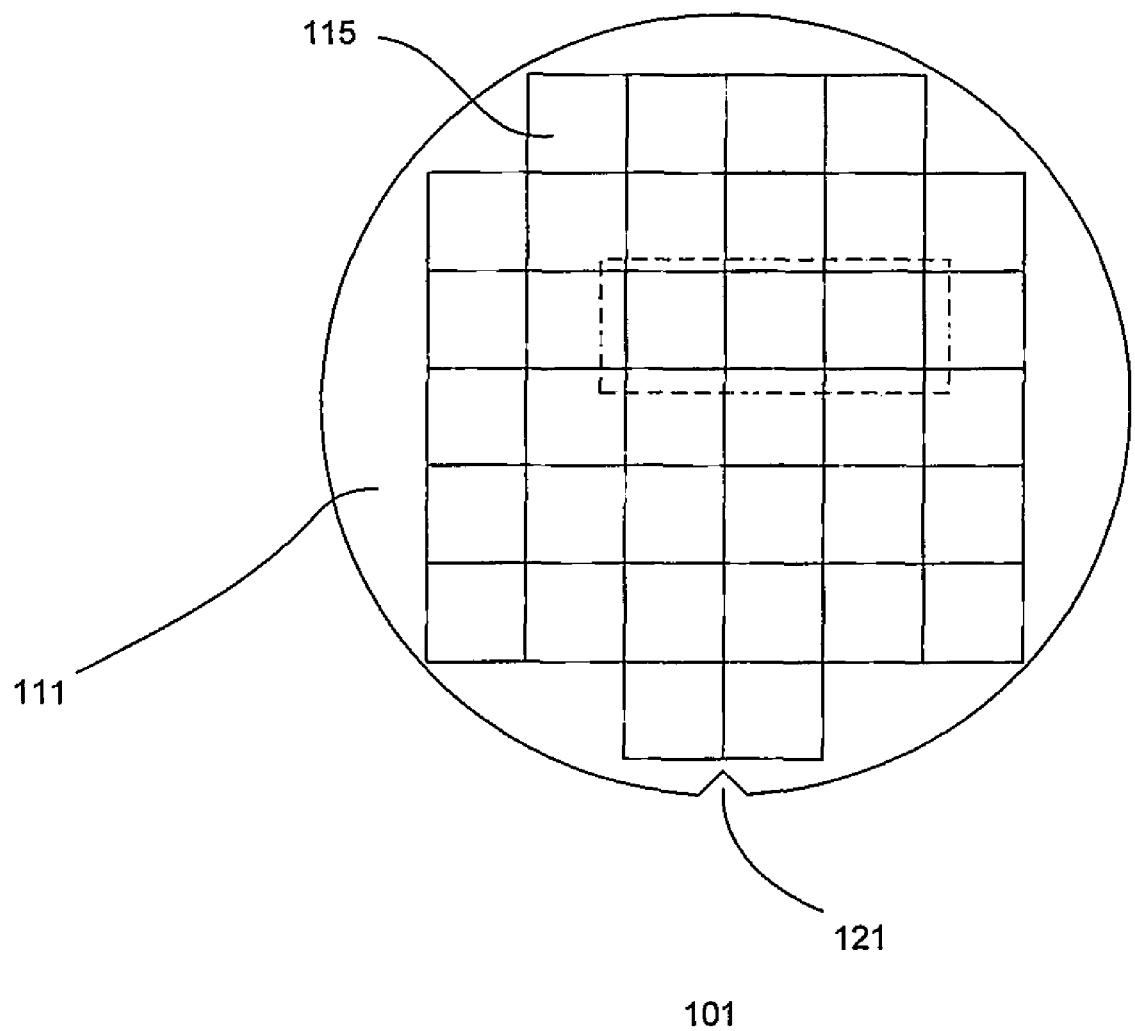
FIG. 1a shows a semiconductor wafer.

FIG. 1a shows a semiconductor wafer 101. The semiconductor wafer, for example, comprises a silicon wafer. Other types of wafers are also useful. For example, the wafer may be a p-type, n-type, silicon-on-insulator or silicon germanium wafer. Depending on the type of device, the wafer may comprise a non-semiconductor material. The wafer may include a notch 121 to indicate the crystal orientation of the wafer. Other techniques for indicating the crystal orientation may also be useful. Additional indicators may also be included to indicate the dopant type of the wafer.

The wafer includes an active surface 111 on which devices 115 are formed. A plurality of devices may be formed on the wafer in parallel. The devices, for example, are arranged in rows along a first (x) direction and columns along a second (y) direction. The devices are subsequently singulated into individual dies, assembled and tested. In other embodiments, the wafer may include a single device.

The fabrication of devices, such as integrated circuits (ICs), involves the formation of features on a substrate that make up circuit components, such as transistors, resistors and capacitors. The devices are interconnected, enabling the device to perform the desired functions. Interconnections are formed by forming contacts and conductive lines in a dielectric layer using, for example, damascene techniques. The features and interconnections are formed by repeatedly depositing and patterning layers on the wafer. The devices may have multiple interconnection layers. The structures of the different layers of the device are created or patterned using respective mask and etch techniques.

Figure 1B:
FIG. 1b shows a portion of a wafer.

FIG. 1b shows a portion 105 of the wafer of FIG. 1a in greater detail. As shown, the portion comprises three adjacent dies 115 of a row in the x-direction. Portions of dies on adjacent rows and columns (in the y direction) are also shown. A die, for example, comprises a rectangular shape. Within the die may be various device regions 118, such as array and logic regions.

A scribe region or line is disposed around a die. For example, scribe lines 120a in the x direction and scribe lines 120b in the y direction separate the dies on the wafer. The scribe lines provide an area for a wafer saw to cut the wafer to singulate the dies. The scribe lines may be, for example, about 50-200 μm in width. Providing scribe lines of other widths is also useful.

The various features and interconnections are strategically placed on the device to minimize the use of space and/or optimize performance. The placement of various features and interconnections is referred to as a product or device layout.

The product layout is contained in an artwork file. The artwork file contains information of the product layout. For example, the various layers of the product are contained in one or more artwork files. The artwork files can be various types of artwork files. The artwork files, for example, can be GDSII, LEF, DEG, OASIS or CIF types of files. Other types of artwork files may also be useful.

In the design process, portions or chiplets of an IC may be contained in individual files. Furthermore, different layers of the chiplets may also be contained in separate files. The different artwork files are combined to produce 3-dimensional information of the complete device of IC.

Figure 2:
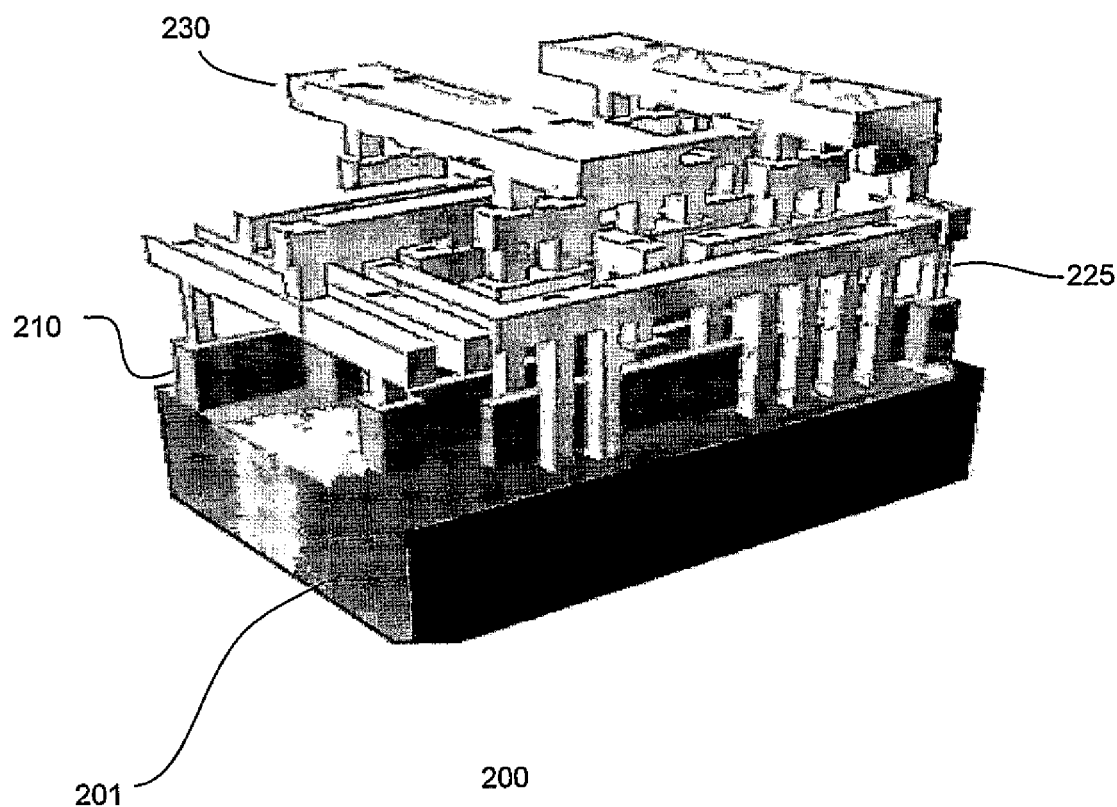
FIG. 2 shows a 3-dimensional rendering of a cell.

FIG. 2 illustrates a 3-dimensional rendering of an example of a cell. The cell includes a substrate 201 with a patterned polysilicon layer 210 which forms polysilicon lines. The polysilicon lines, for example, represent gate electrodes of transistors. Three metal layers 230 are provided in the cell. The metal layers are coupled to the substrate and gates by contacts represented by posts 225.

Figure 3A:
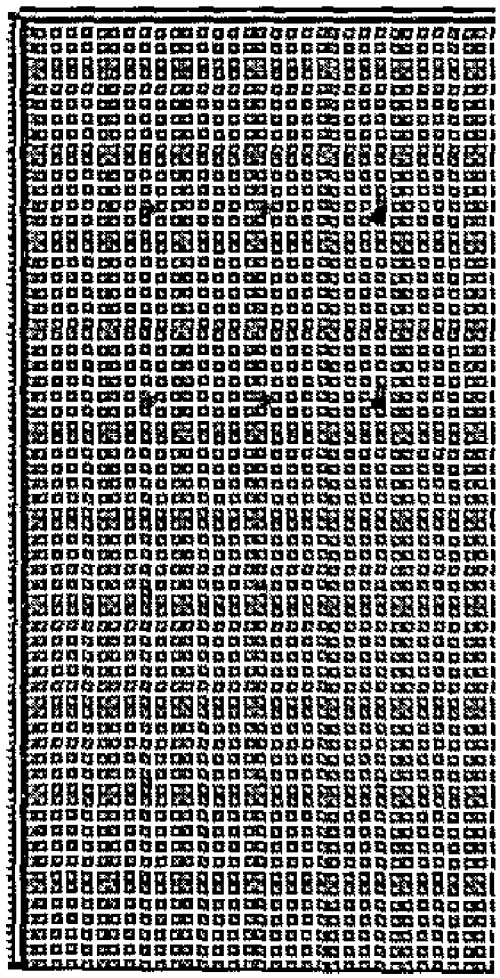
FIGS. 3a-b show embodiments of a test chiplet.

FIG. 3a shows an embodiment of a test chiplet 330 which facilitates defect detection. In one embodiment, the test chiplet facilitates D0 testing. Providing test chiplets which facilitate other types of testing is also useful. The test chiplet can be employed for inline or offline testing.

The test chiplet, in one embodiment, comprises a plurality of cells. In one embodiment, the cells are arranged in an array 334. The array may be an M×N array, where M and N are whole numbers. It is understood that M can be equal to or not equal to N. Other arrangements of the cells are also useful.

A cell, for example, comprises patterned structures. Preferably, the patterned structures are similar to those in the actual device or cell. For example, the structures of the cell should have characteristics of structures of the actual device, such as, for example, pitch, critical dimension (CD) and density.

Figure 3B:
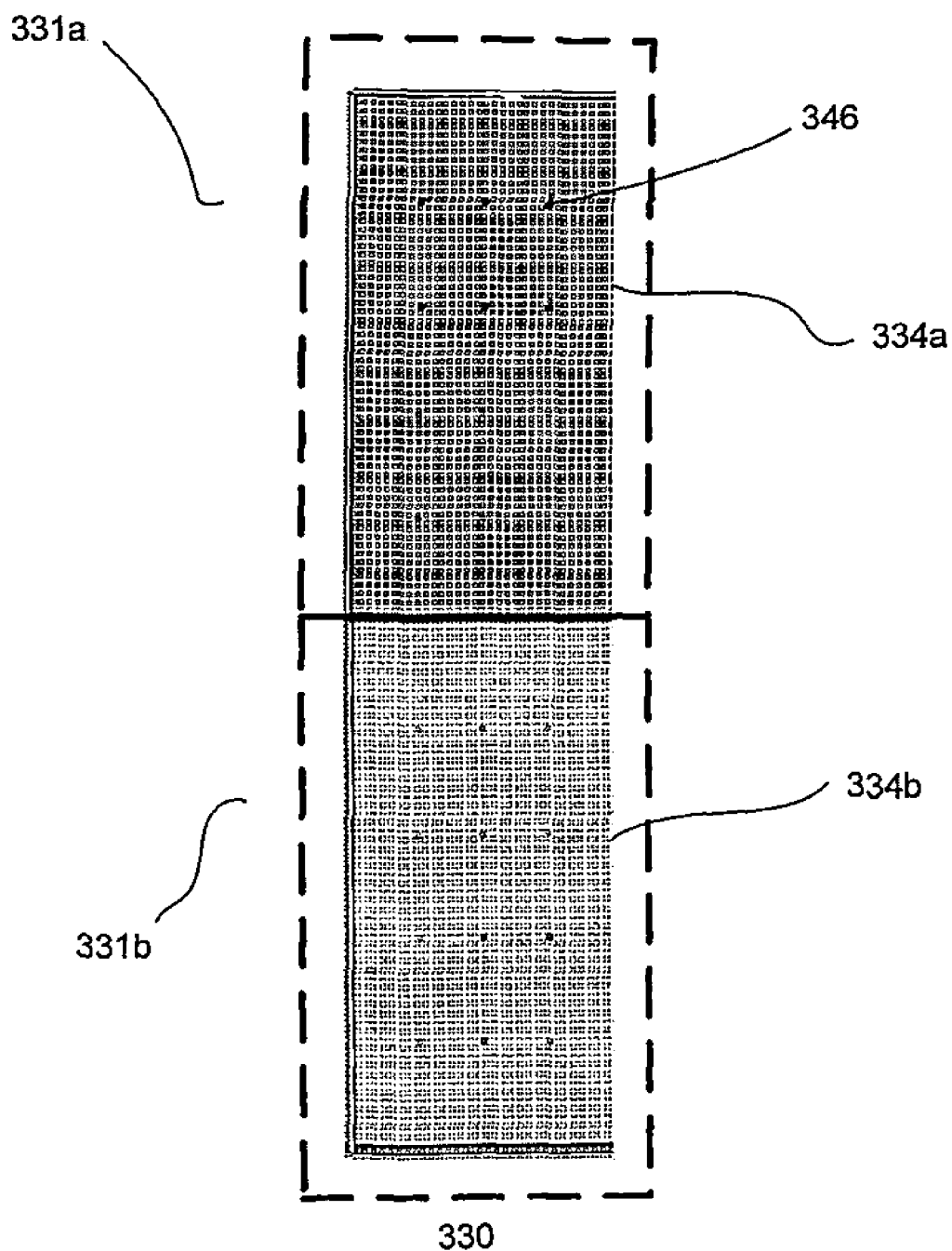

In one embodiment, the array comprises identical cells. Providing an array with identical cells may be advantageous since it may more closely simulate overall structure or conditions of an actual chiplet or portion of a device. Alternatively, the array may comprise different types of cells. In other embodiments, the test chiplet may include a plurality of sub-regions with sub-arrays of cells. In one embodiment, a sub-array comprises identical cells. Providing a plurality of sub-regions allows for different types of cells to be included in the test chiplet. For example, as shown in FIG. 3b, a test chiplet 330 comprises first and second sub-regions 331a-b with first and second sub-arrays of cells 334a-b. Providing a test chiplet with other cell arrangements may also be useful.

In one embodiment, at least one cell of the test chiplet is programmed with a defect 346. For example, a cell is intentionally designed with a defect. In one embodiment, one defect is programmed in a cell. The defects preferably include subtle defects which may be difficult to detect. For example, the signal-noise ratio of subtle defects may be marginal, making them difficult to detect. Such defects may include defects related to bridging or broken patterns. Depending on the layer of the device, the defects may be related to active areas on the substrate, polysilion lines, contacts or vias, or metal lines.

By programming defects into the cells, the types of defects and their locations are known. This facilitates development of detection recipes from detection tools which can be tailored to detect subtle defects. Various types of detection tools may be employed. For example, inspection tools may be optical or ebeam inspection tools. Optical inspection tools may include a Brightfield Inspector from KLA or an UVision from AMAT while ebeam inspection tools may include an eScan3xx from HMI, an eS3x from KLA or a SemVision from AMAT. Other types of inspection tools are also useful.

Figure 4A:
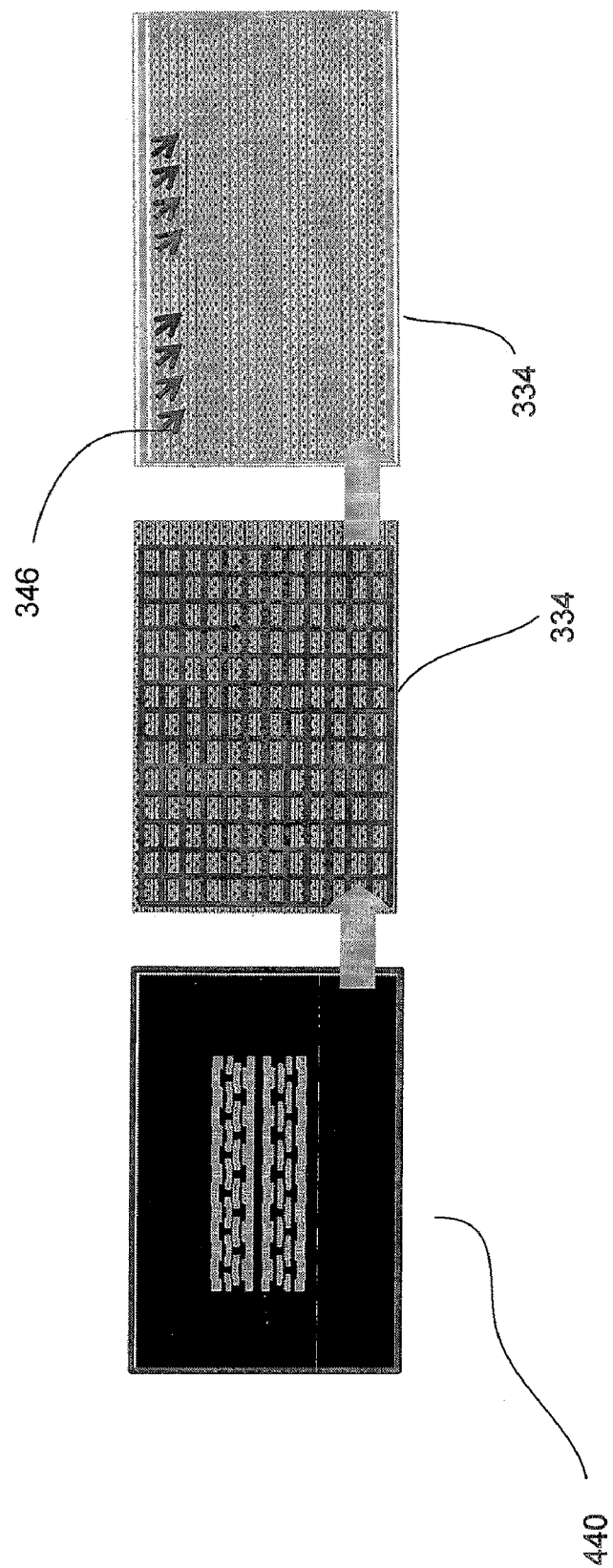
FIGS. 4a-b show an embodiment of a cell.

FIG. 4a shows an exemplary embodiment of a cell 440. The cell may comprise an active unit cell structure of a device. For example, the cell may comprise an SRAM unit cell structure at the active level. A plurality of cells are arranged to form an M×N array 334 of the test chiplet. For example, the cells are arranged in a 12×13 array. In one embodiment, at least one defect 346 is designed into one of the cells of the array. As shown, defects 346 are designed into some of the cells of the array. In other embodiments, all the cells of the array may be designed with defects.

Figure 4B:
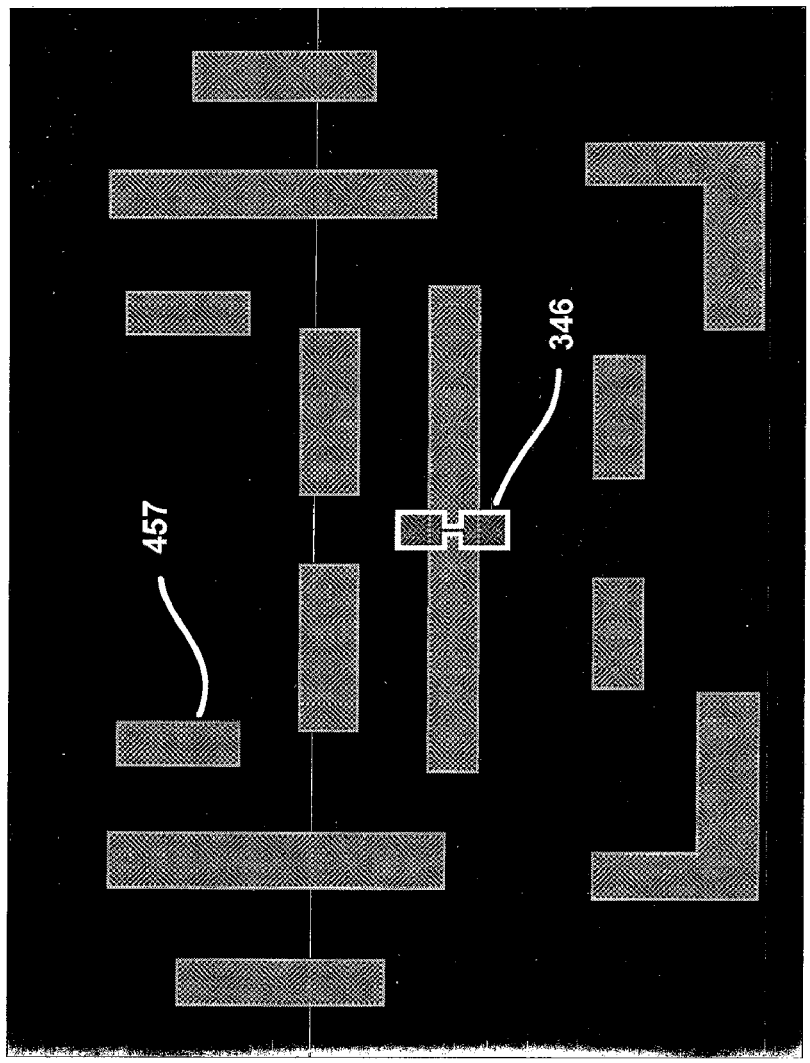

FIG. 4b shows an exemplary embodiment of a cell 440 in greater detail. As shown, the cell comprises active lines 457. The active lines, for example, are similar to critical active line structures that exist in the device, such as in the logic area of a device. The critical line structure may include known weak points of a designed pattern or core working structures that determine a functionality of the particular device. Other types of structures are also useful.

A defect 346 is intentionally designed into one of the structures. The defect, for example, comprises narrowing the line to cause an open line in the resulting structure on the test chiplet. Without the defect designed in, the resulting structure would be a continuous line. Designing other types of defects into the cell is also useful. For example, bridging or electrical shorts can be designed into two separate lines.

Figure 5:
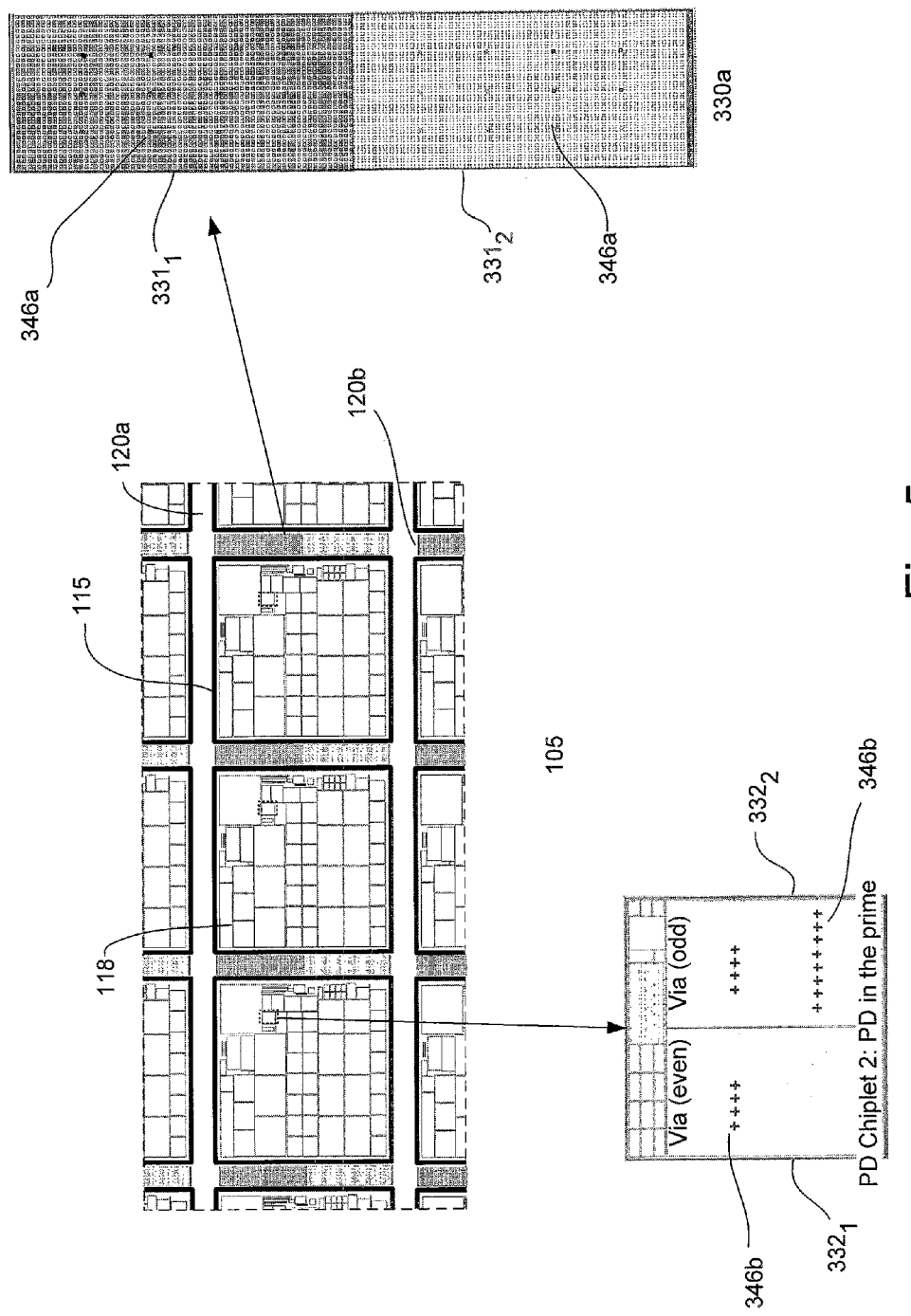
FIG. 5 shows a portion of a wafer.

FIG. 5 shows a portion 105 of the wafer, similar to that of FIG. 1b. As shown, the portion comprises three adjacent dies 115 of a row in the x-direction. Portions of dies on adjacent rows and columns (in the y direction) are also shown. A die, for example, comprises a rectangular shape. Within the die may be various device regions 118, such as arrays and logic regions. First scribe lines 120a in the x direction and second scribe lines 120b in the y direction separate the dies on the wafer.

In one embodiment, a test chiplet 330a is disposed in the scribe region of the wafer. The test chiplet comprises a plurality of sub-arrays 331 of cells programmed with defects 346a. The test chiplet, for example, comprises first and second sub-arrays $331_1$ and $331_2$. As shown, the test chiplet is disposed on the second scribe regions 120b in the y direction adjacent to the die. Placing test chiplets in the first scribe regions or both first and second scribe regions is also useful. Alternatively, one or more test chiplets 330b can be disposed within a die. The test chiplet, for example, comprises first and second sub-arrays $332_1$ and $332_2$ having cells with via structures. The test chiplet is programmed with defects 346b. In other embodiments, test chiplets can be disposed both within the dies and in the scribe regions. Disposing the test chiplet within the die may more accurately reflect structures of the die but at the expense of increased die size.

FIGS. 6a-f show various examples of simulations of programmed defects 346 and corresponding printed patterns on a substrate with an actual defect 646.

Figure 6A:
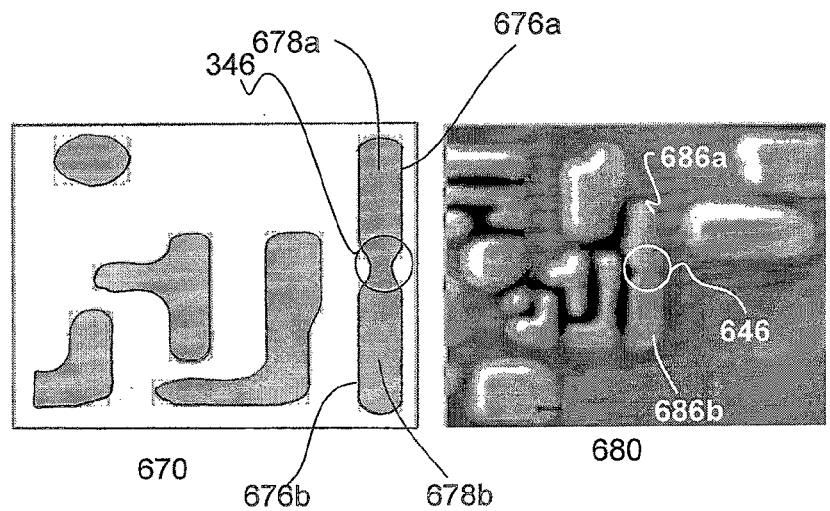
FIGS. 6a-f show examples of simulations of programmed defects and corresponding printed patterns on a substrate.

Referring to FIG. 6a, a simulation 670 of various structures of a cell with the intended patterns 676a-b is shown. The structures, as shown, are structures at the active layer of the cell. As shown, the intended patterns of the structures have geometric shapes which include straight lines or corners. The intended patterns may be modified by, for example, optical proximity correction techniques, to produce a structure on the substrate with the modified pattern. The modified patterns 678a-b, for example, may include rounded corners and/or changes in widths. Based on the simulation, a mask is formed which is used to replicate or print the pattern 680 onto a substrate or wafer.

In accordance with one embodiment, a defect 346 is programmed into the cell. As shown, the defect bridges two separate features 676a-b. The defect 646, when printed onto a substrate, causes bridging or shorting of two features 686a-b together.

Figure 6B:
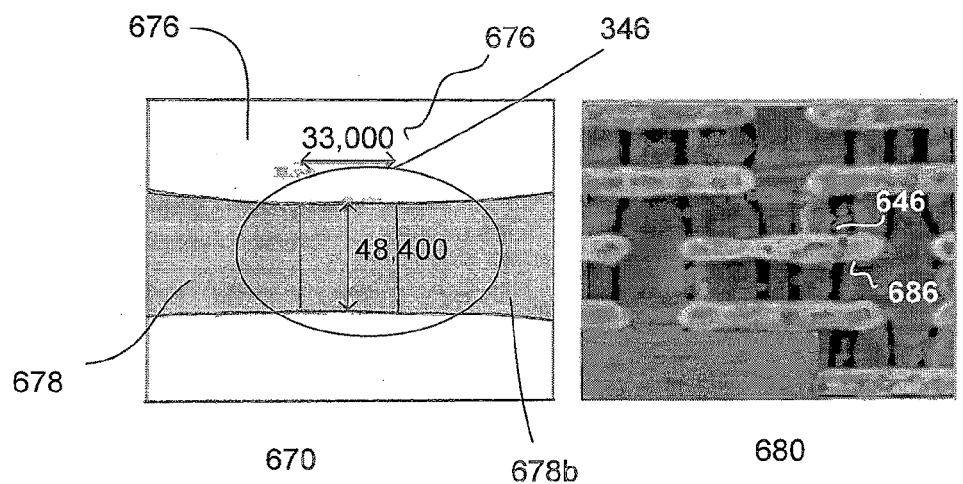

In FIG. 6b, a simulation 670 of a structure of a cell with the intended pattern 676 is shown. The structures, as shown, are structures at the polysilicon layer of the cell. The intended structure may comprise a polysilicon line corresponding to, for example, a gate conductor. A defect 346 is programmed into the cell. The defect 646, when printed onto a substrate, causes necking of a structure. This increases resistance of the polysilicon line. Under extreme process conditions, the defect may cause an open in the polysilicon line.

Figure 6C:
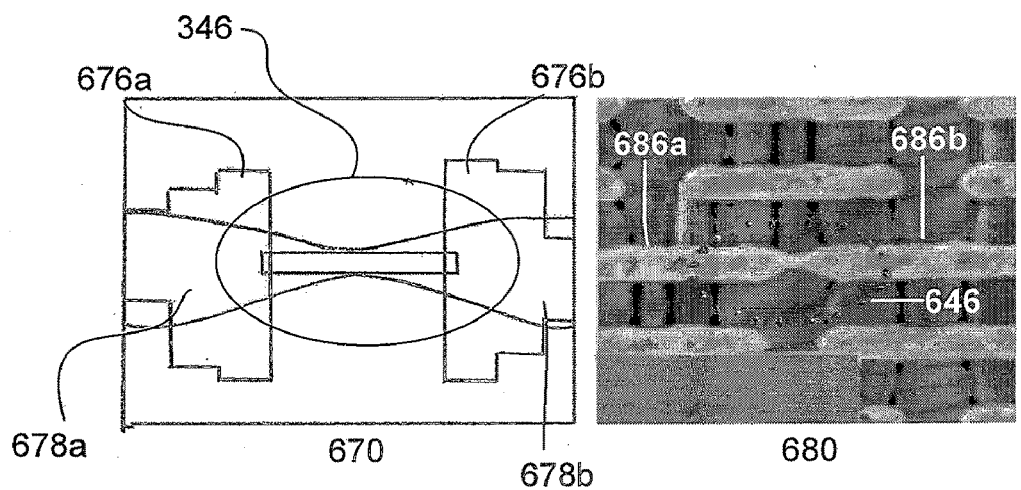

In FIG. 6c, a simulation 670 of two separate structures of a cell with the intended patterns 676a-b is shown. The structures, as shown, are structures at the polysilicon layer of the cell. The intended structures may comprise polysilicon lines corresponding to, for example, gate conductors. A defect 346 is programmed into the cell. The defect 646, when printed onto a substrate, causes bridging or shorting of two polysilicon lines 686a-b.

Figure 6D:
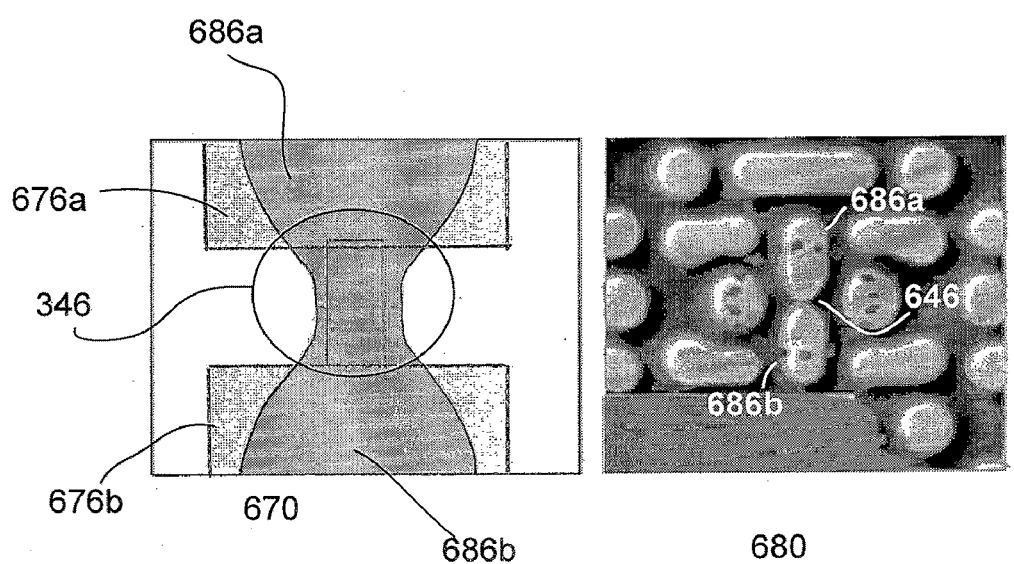
Figure 6E:
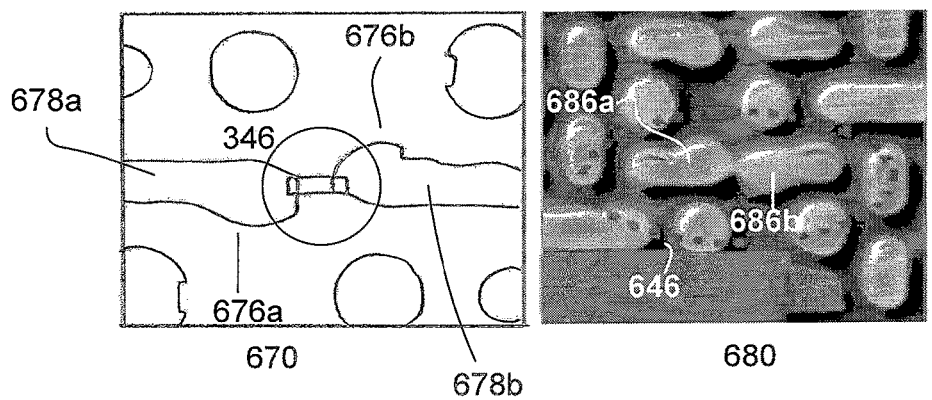

FIGS. 6d-e illustrate a simulation of intended patterns 676a-b of two structures. The structures, as shown, are structures at the metal layer of the cell. The two structures include a defect 346 which connects the two structures. Modified patterns 678a-b created by, for example, optimal proximity correction (OPC) are shown. The printed pattern 680 on the substrate shows the two separate features being too close together as a result of the defect 646, which can cause leakage.

Figure 6F:
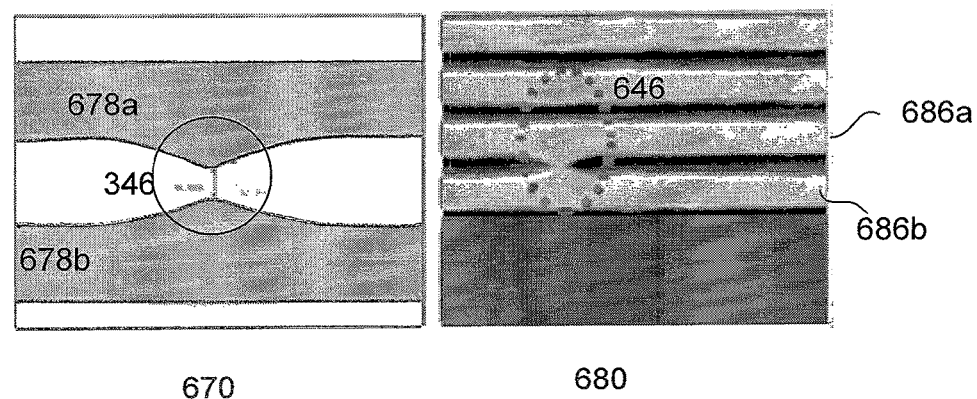

Referring to FIG. 6f, a simulation of two line features 678a-b is shown. A defect 346 is programmed between the two lines. The printed pattern 680 shows that the two lines are bridged due to the defect 646.

FIGS. 7a-l show various other examples of programmed defect design patterns or structures and corresponding printed patterns on a substrate.

Figure 7A:
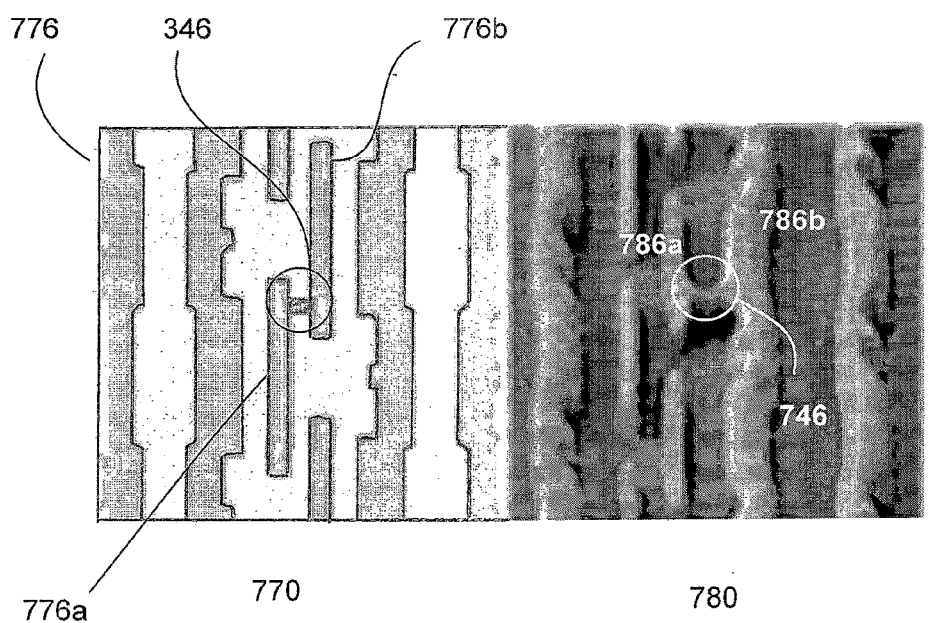
FIGS. 7a-l show other examples of simulations of programmed defects and corresponding printed patterns on a substrate.
Figure 7B:
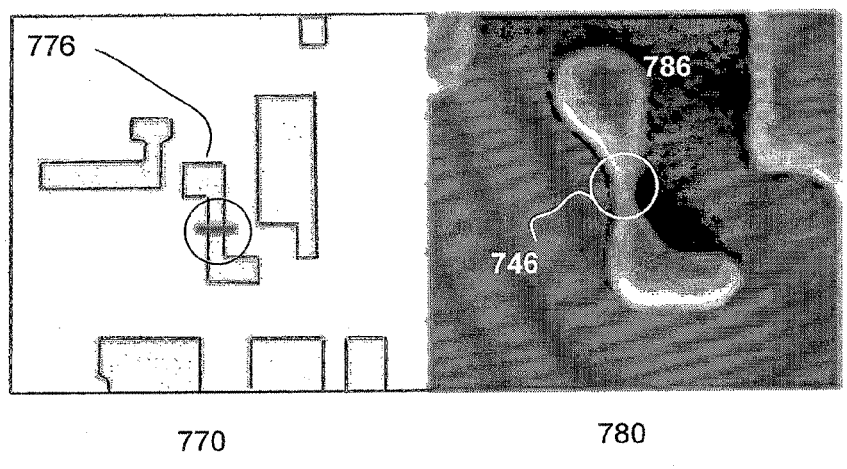

Referring to FIGS. 7a-b, design patterns or structures 770 and corresponding actual printed patterns 780 of active layers of cells are shown. As shown, the design structures include patterns of active area features 776. A defect 346 is programmed into the cell. In FIG. 7a, the defect produces a bridge 746 between two features 786a-b on the substrate, creating a short. On the other hand, the defect in FIG. 7b produces a neck 746 within a feature 786, increasing resistance or forming an open connection.

Figure 7C:
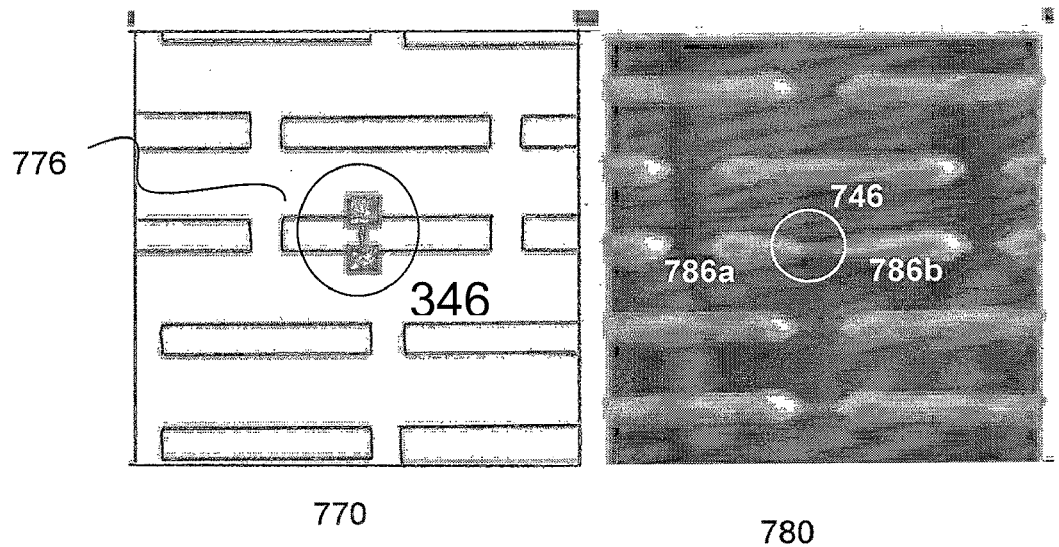
Figure 7D:
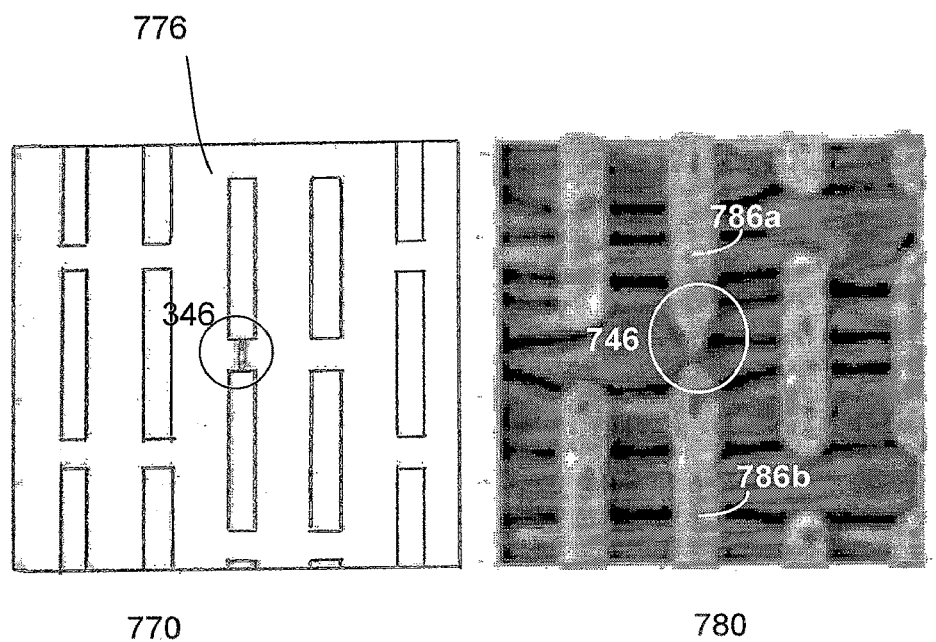

In FIGS. 7c-d, design structures 770 and corresponding actual printed patterns 780 from polysilicon conductor layers of cells are shown. As shown, the design structures include patterns of gate conductor features 776. Defects 346 are programmed into the cells. In FIG. 7c, the defect produces a neck 746 within a conductor 786, increasing resistance or forming an open connection. In contrast, the defect in FIG. 7d produces a bridge 746 between two gate conductors 786a-b on the substrate, creating a short.

Figure 7E:
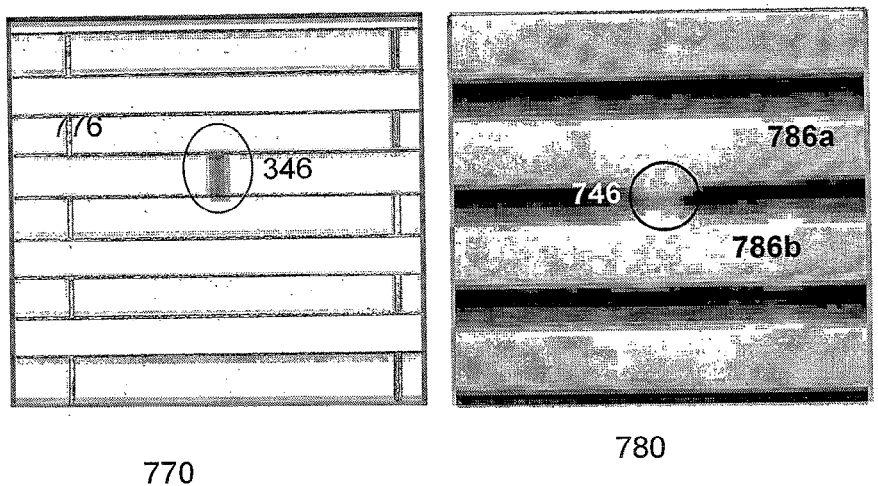
Figure 7F:
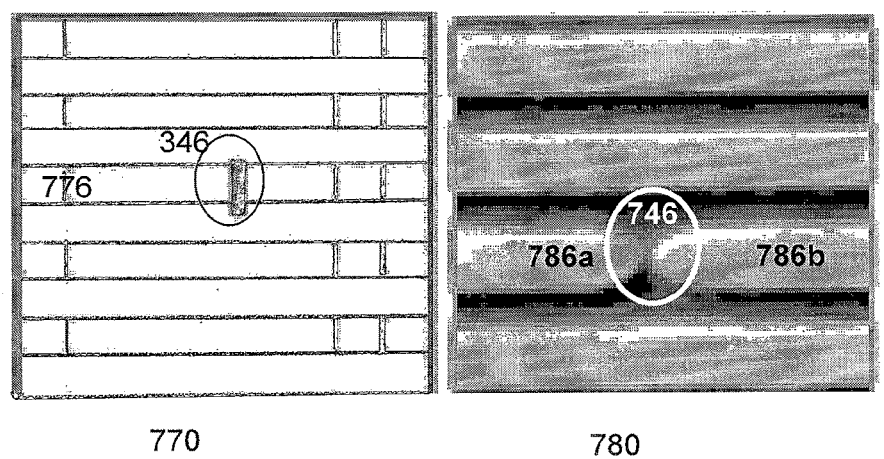
Figure 7G:
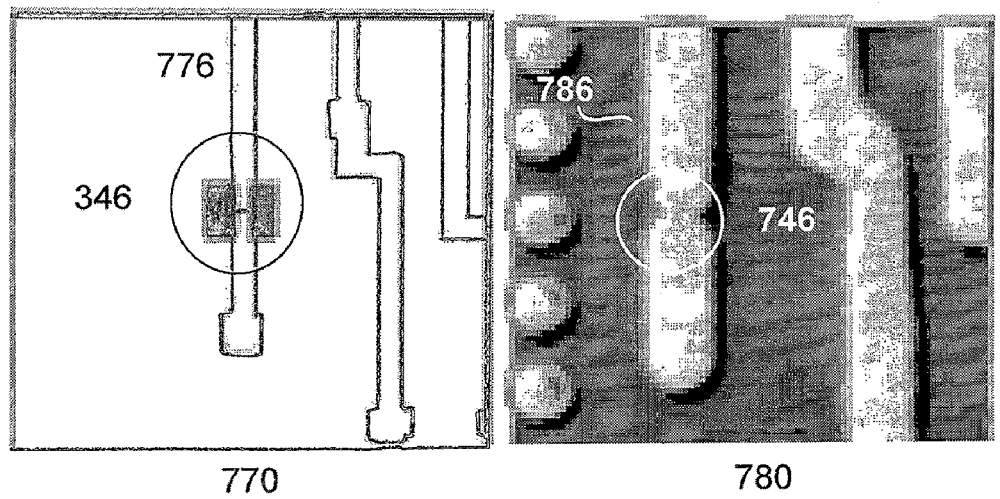
Figure 7H:
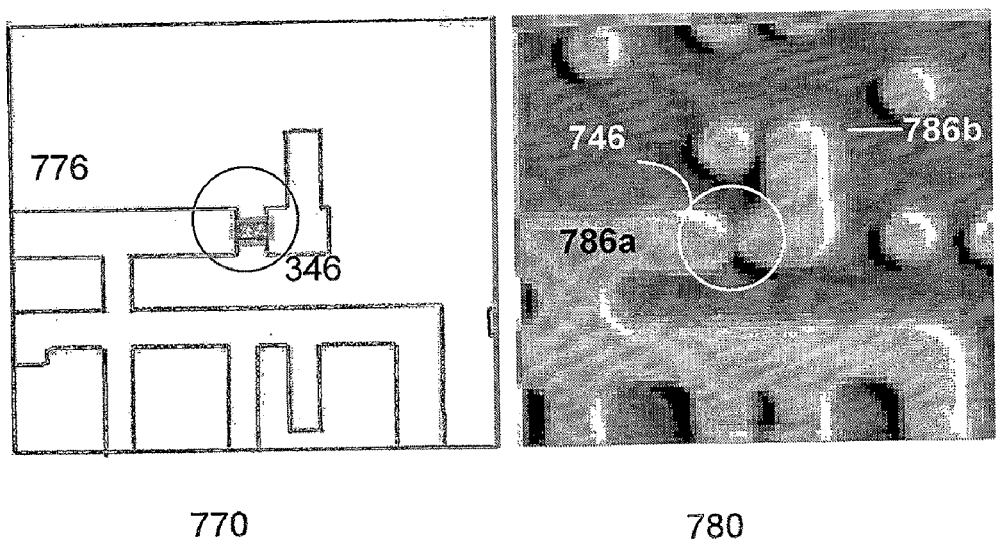

As for FIGS. 7e-h, design structures 770 and corresponding actual printed patterns 780 from, for example, interconnect layers of cells are shown. The design structures and printed patterns, alternatively, may correspond to other process layers. For example, the design structures and printed patterns may correspond to the active layer, polysilicon layer, implant layer or a combinations thereof, including interconnect layers. The design structures include patterns of parallel line structures 776. Defects 346 are programmed into the cells. In FIGS. 7e and 7h, the defects produce bridges 746 between two adjacent structures or lines 786a-b on the substrate, creating shorts. In FIGS. 7f and 7g, the defects produce necks 746 within the features 786, increasing resistance or forming an open connection.

Figure 7I:
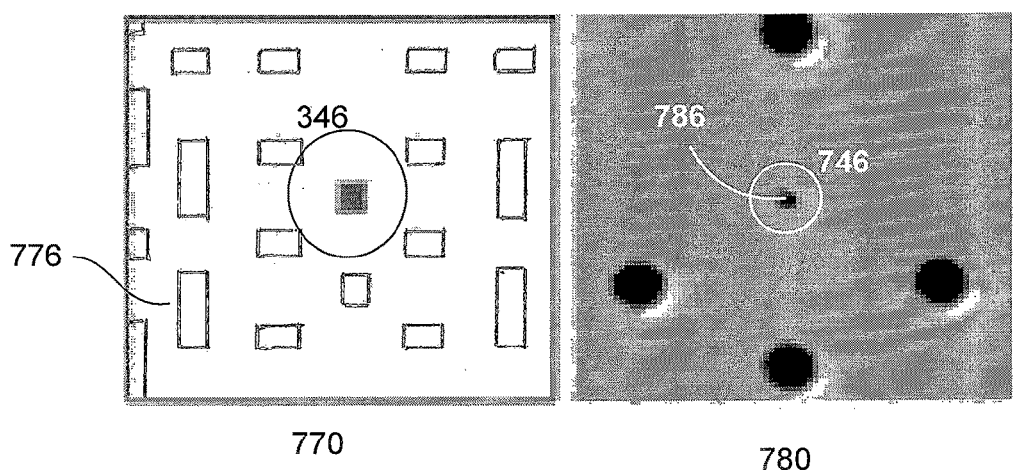
Figure 7J:
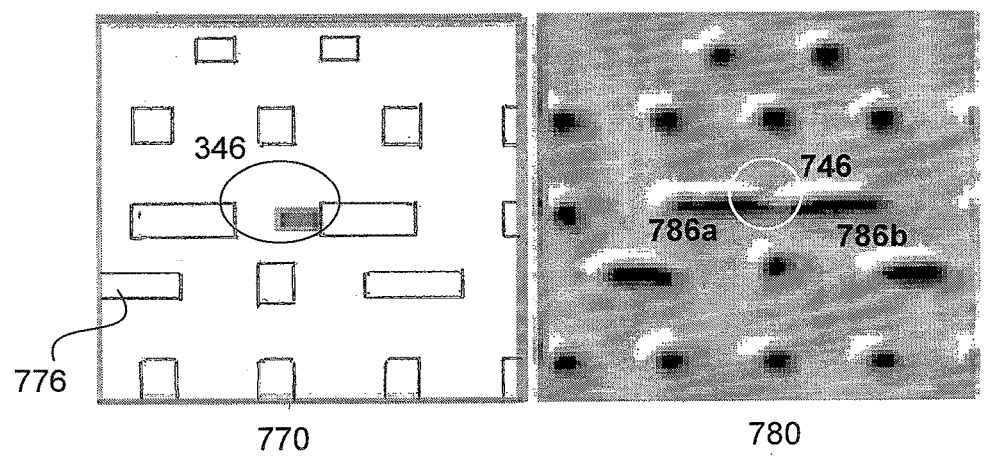
Figure 7K:
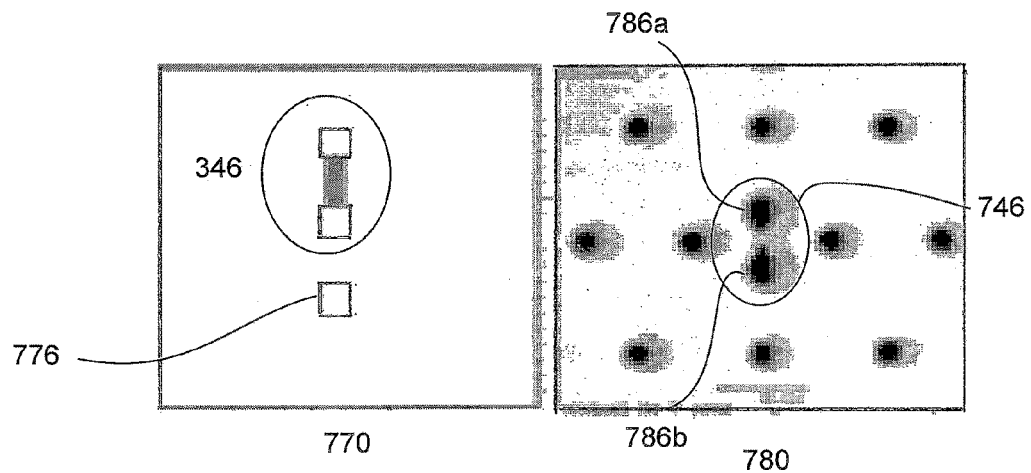
Figure 7L:
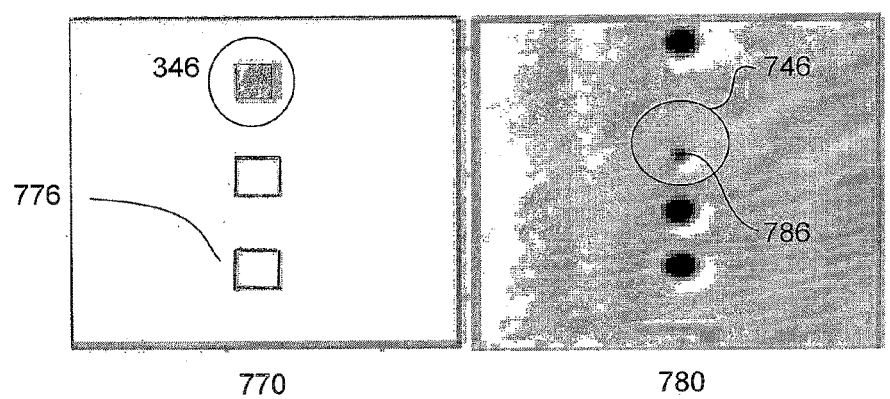

Referring to FIGS. 7i-l, design structures 770 and corresponding actual printed patterns 780 from contact or via levels of cells are shown. The design structures include patterns of contacts or vias 776. Defects 346 are programmed into the cells. In FIGS. 7i and 7l, the defects 746 produce missing contact holes due to the reduced size 786. This results in increased resistance or open connections. In FIGS. 7j-k, the defects produce merged contact holes due to enlarged vias or extension via holes. This results in shorts or leakage.

Figure 8:
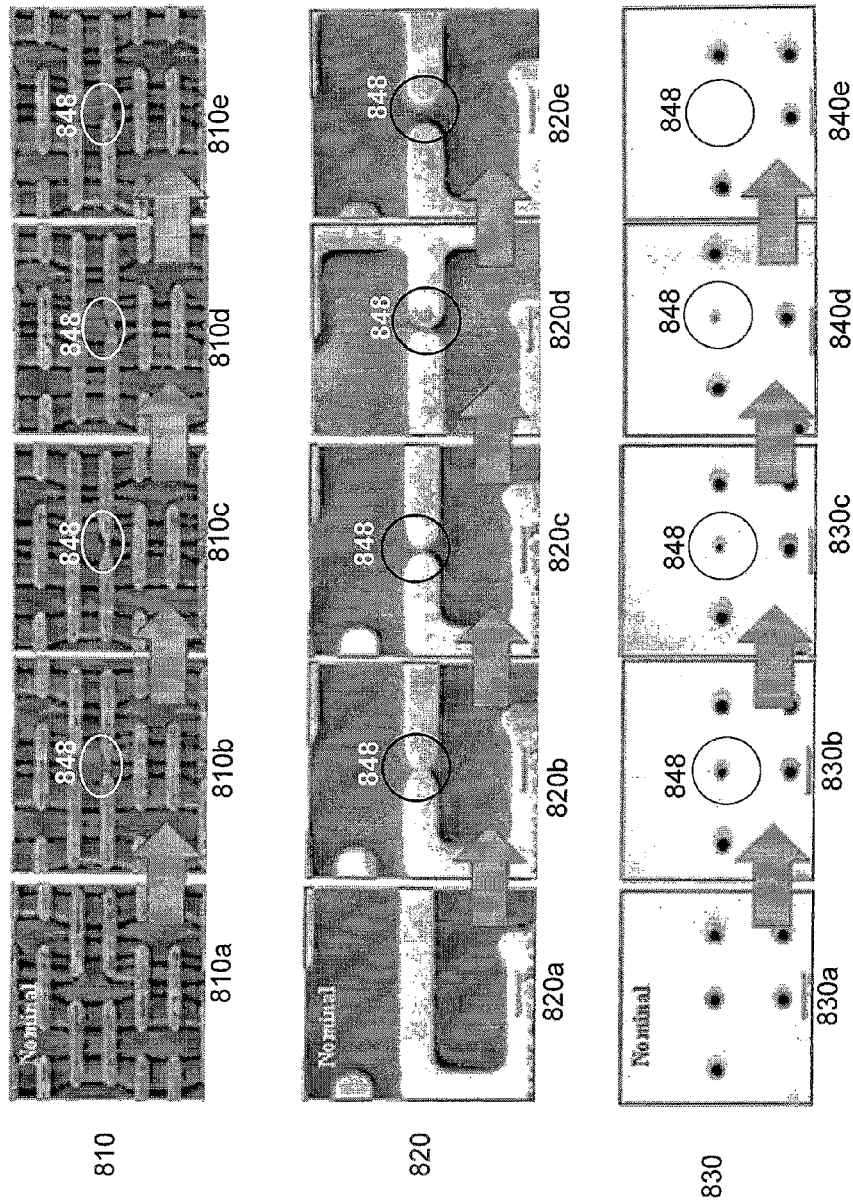
FIG. 8 shows evolutions of defects from various physical features.

FIG. 8 shows evolutions of defects from various physical features on a substrate. A first defect evolution 810 involves nominal structures 810a which correspond to polysilicon line features on a substrate. Bridging defects 848 having various dimensions are programmed into the polysilicon line features 810b-e. As the bridging defect dimension progressively increases, current leakage occurs and increases until a short results.

A second defect evolution 820 involves nominal structures 820a which correspond to metal lines. Necking defects having various dimensions are programmed into the metal line features 820b-e. As the necking defect dimension progressively increases, resistance increases in the metal line until a complete open results.

A third defect evolution 830 involves nominal structures 830a which correspond to contact or via openings. Necking defects having various dimensions are programmed into the contact openings 830b-e. As the necking defect dimension progressively increases, the contact opening becomes increasingly smaller until it is completely missing from the pattern.

Some defects may be subtle defects. As device dimensions scale downwards, these subtle defects can become killer defects. Furthermore, subtle defects are difficult to detect.

Inspection tools are used to detect defects that occur during manufacturing of the devices. The inspection tools, for example, include optical or ebeam types of inspection tools. In one embodiment, the inspection tool may be a brightfield inspection system manufactured by KLA-Tencor. For example, the inspection system may be a KLA-Tencor 28xx Brightfield Inspection System. Other types of defect inspection systems may also be useful. For example, inspection systems, such as UVision and Semvision systems from Applied Materials, eScan3xx systems from Hermes-Microvision or eS3x systems from KLA-Tencor, may also be useful.

Numerous setup modes are provided to program the operation of the inspection tool. Usually, each setup mode may include various parameters which can be selected or input by a user. FIG. 9a shows a programming menu 900 of a KLA-Tencor 2825 Brightfield Inspection System. As shown, the programming menu includes a plurality of setup modes 910a-k. The setup modes may include scan, spectrum, imaging, pixel size, focus, segmentation, threshold, merge, cell size, ID0 and signal modes. The various modes can be set to achieve the desired result. It is understood that additional setup modes may be included in the menu or that different inspection tools may have different setup modes. Table 1 provides an explanation of the different modes.

TABLE 1

| Mode | Function |
| --- | --- |
| Scan | Setting for inspection mechanism, e.g., die to die or cell to cell comparison |
| Spectrum | Setting for UV light wavelength that reflects signals from wafer surface |
| Imaging | Setting for light aperture that controls ways of light being flashed onto wafer surface |
| Pixel size | Setting for "unit" of light forming a pixel in 1 inspection |
| Focus | Setting for the depth of inspected structures, e.g., flat surface vs contact/via holes inspection. |
| Segmentation | Setting to define the breaks between different grey levels to cater specific threshold setting for certain regions |
| Threshold | Setting for signal level of which below it will not be detected in 1 inspection |
| Merged | Setting for grouping adjacent signals into 1 big signal in 1 inspection |
| Cell Size | Setting for size of inspected cell, e.g., memory structure. Different cell size requires different pixel size for better signal pixilation |
| ID0 | Setting for special feature that enable user to isolate similar captured defects into specific group |
| Signal | The amount of light reflected back to detector |

Figure 9B:
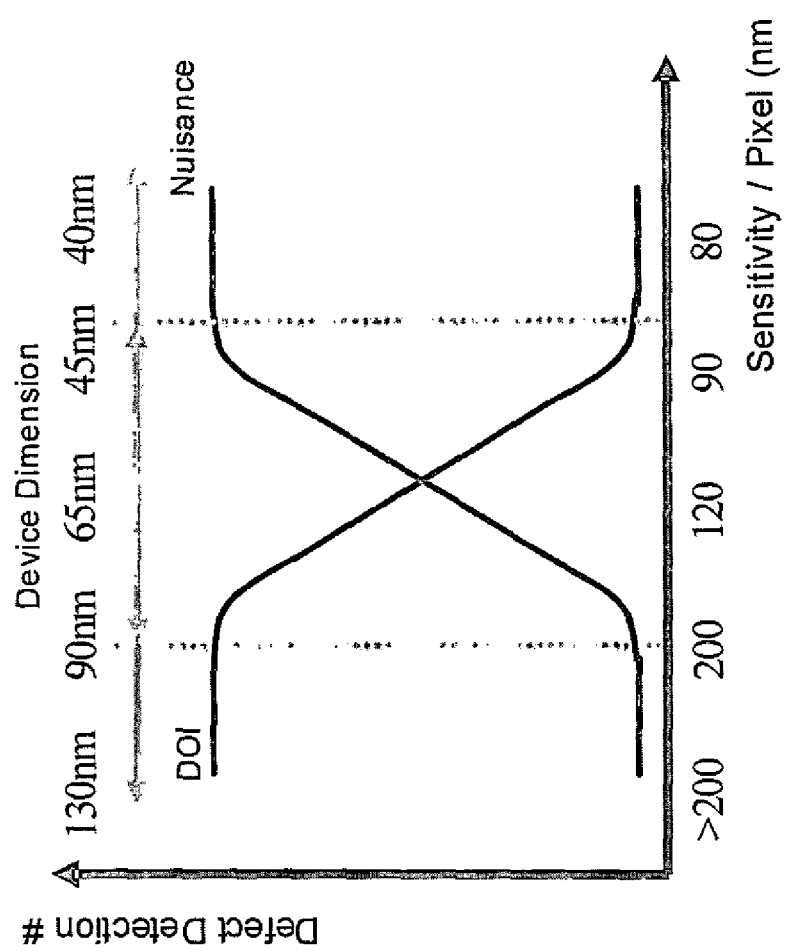
FIG. 9b shows a graph charting the number of defect detection with device dimension and pixel size.

An inspection recipe is a combination of parameters from each setup mode. Programming the inspection tool with the appropriate inspection recipe is important in suppressing nuisance signals while capturing physical defects or defects of interest (DOI). This is particularly true when the magnitude of the DOI signals is low compared to that of the nuisance signals. FIG. 9b shows a graph 905 charting the number of defect detection of nuisance defects and DOIs with device dimension and pixel size. As can be seen, as device dimensions decrease, for example, from 90 nm to 45 nm, the magnitude of DOI signals progressively decreases compared to that of nuisance signals. This results in decreasing amounts of DOIs being detected while the amounts of detection of nuisance defects increase.

Figure 10A:
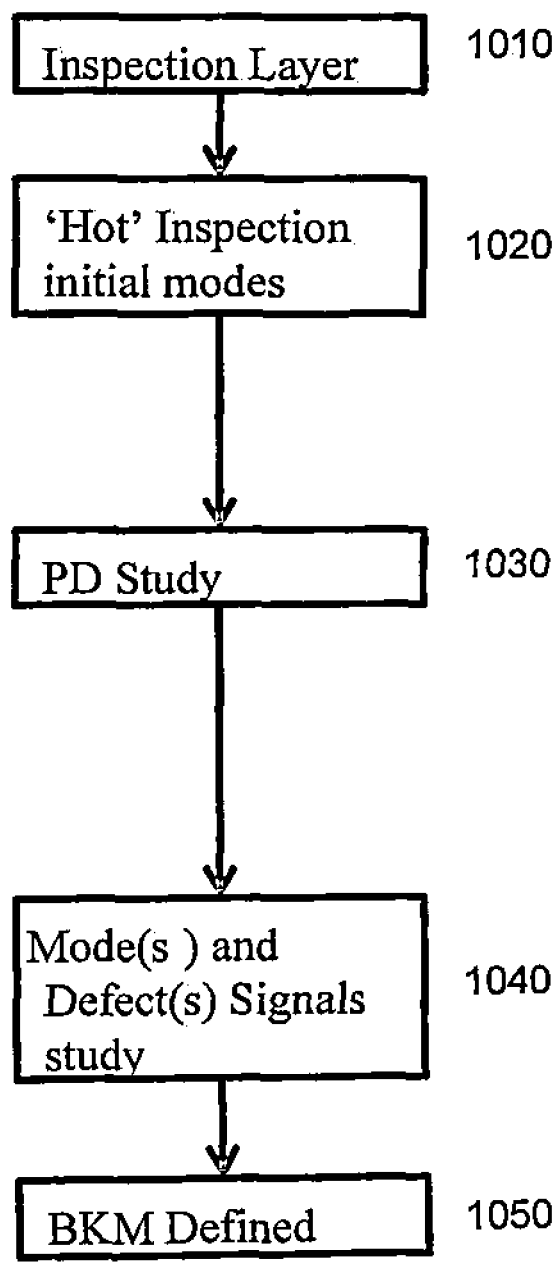
FIG. 10a shows an embodiment of a process for defining a defect detection recipe.

FIG. 10a shows an embodiment of a process 1000 for defining a defect detection recipe for an inspection. The process can be applied to various types of inspections. For example, the process can be applied to optical or ebeam types of inspection tools. The defect detection recipe enables good DOI capturing while suppressing nuisance defect capturing. The defect detection recipe may serve as a best known method (BKM) recipe for inspecting a specific type of layer, defect, device region and/or device.

In one embodiment, a substrate prepared with a desired processed layer or level for detection is provided at step 1010. The substrate, for example, may be a semiconductor wafer such as a silicon wafer which is used to form a plurality of devices in parallel. Other types of substrates or wafers may also be used. The processed layer can be any processed layer of a device. For example, the processed layer can be an active layer, a polysilion layer, a contact or via layer or interconnect layer. Furthermore, a device may have more than one type of device regions. For example, a device may have an array region of memory cells, such as SRAM cells, and a logic region. Other types of memory cells and/or device regions may also be included in the device.

Figure 10B:
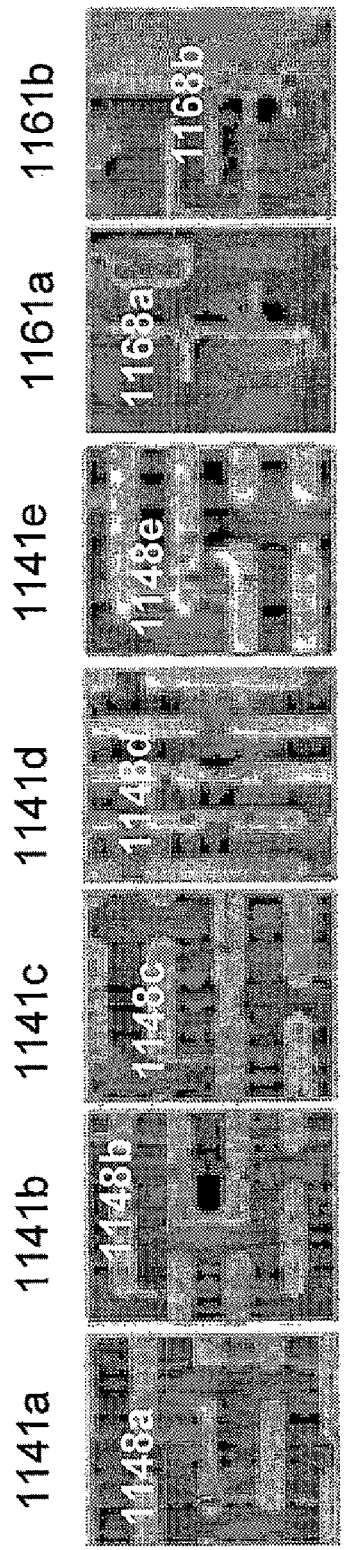
FIG. 10b shows an example of PDs being disposed in cells.

The processed layer, in one embodiment, includes one or more test chiplets. A test chiplet, for example, includes a plurality of cells which have programmed defects or PDs. The test chiplets may be disposed in the scribe regions of the wafer and/or within the devices. The PDs may be necking or bridging types of PDs. For example, as shown in FIG. 10b, PDs are disposed in cells at the polysilicon layer. PDs at other levels may also be useful. In one embodiment, cells 1141a-e are SRAM cells at the polysilicon layer while cells 1161a-b are logic cells. SRAM cell 1141a is programmed with a necking defect 1148a while SRAM cells 1141b-c are programmed with bridging defects 1148b-c. SRAM cell 1141d is programmed with a subtle bridging defect 1148d between ends of polysilicon line features. As for SRAM cell 1141e, it is programmed with a lateral bridging defect 1148e between two adjacent polysilicon line features. Logic cells 1161a-b are programmed with different types of bridging defects 1168a-b. Providing other types of cells and/or programming the cells with other types of defects may also be useful. The defects may also be programmed into other cell layers.

At step 1020 of FIG. 10a, the substrate is inspected using an initial defect detection recipe. The initial defect detection recipe, for example, is set to be sensitive to capture all possible types of defects, even those with very low signals. The initial defect detection recipe, for example, comprises a "Hot" initial recipe. The inspector scans the wafer with a recipe of a hot initial recipe to acquire defect signals on the wafer. The inspector scans the wafer using the different recipes of the hot initial modes. The results of the inspection using the hot recipe are collected and stored.

In one embodiment, a PD study is conducted at step 1030 on the results of the inspection using the hot initial recipe. The PD study, for example, comprises examining the PDs as defect of interest (DOI) sites. Based on the study of the defect signals at the DOI sites (e.g., PDs), certain mode parameters may be determined as useful.

A defect signal study is performed at step 1040. The defect signal study includes analyzing the signal-to-noise (S/N) response of the different inspection recipes which have been selected or determined based on the PD study. Since the defects are programmed into the test chiplet, the locations of the different types of defects for a corresponding layer are known. Furthermore, the defects can be correlated to the different types of cells as well. Other signals on the wafer would be considered as noise defects. From studying the defect signals, one can determine the strengths and weaknesses of the different inspection recipe modes.

At step 1050, an inspection recipe out of the group of inspection recipes is selected as the best known method (BKM) recipe for the corresponding process layer. The BKM, in one embodiment, corresponds to the inspection mode having the best S/N response for the different types of defects. The inspection recipe with, for example, the best S/N response average for all the different types of defects can be selected as the BKM. Selecting other inspection recipes based on user requirements may also be useful. For example, if the user is focused on the logic region or the array region, the hot mode with the best S/N response in the logic or array region may be selected as the BKM for the logic or array region. Other BKMs may be defined based on other user requirements.

The process 1000 is performed to define BKMs for all layers of the device. For example, the process steps 1010-1050 are repeated for all layers of the device.

FIG. 11 illustrates an embodiment of a signal study 1100. The signal study analyses, for example, signal-to-noise (S/N) responses of scans using different inspection recipes 1120. The study includes inspections $1120_{1-N}$. As shown, the study includes 14 (N=14) inspections using 14 different inspection recipes. Analyzing other number of inspections or scans may also be useful. The inspection tool may generate different inspection recipes for scanning Based on the PD study, a user may select one, a group of or all the different inspection recipes for the signal study.

S/N responses of DOIs for different inspection recipes were obtained. S/N responses 1140 and 1160 relate to DOIs as described in FIG. 10b. For example, defect signals 1140a-e relate to different types of defects 1148a-e programmed into SRAM cells 1141a-e while defect signals 1160a-b relate to different types of defects 1168a-b programmed into logic cells 1161a-b. Defect signals 1140f relate to nuisance signals in SRAM cell 1141f.

In one embodiment, the S/N responses are obtained by an Optic Selector function of the inspection tool. The Optic Selector function, for example, is used to study the level of a defect signal over the level of noise within the adjacent inspection region. Other techniques for obtaining S/N responses may also be employed.

From the study, different recipes may result in different S/N responses for the various types of DOIs. Averages of the S/N responses 1180 of the various types of DOIs are calculated for the different modes. As can be seen, inspection recipes of scans $1120_2$, $1120_4$ and $1120_{12}$ have the top three S/N response averages of the different scans. These may be considered as potential candidates for the BKM. The candidates may be analyzed to study their capture rates.

Figure 12:
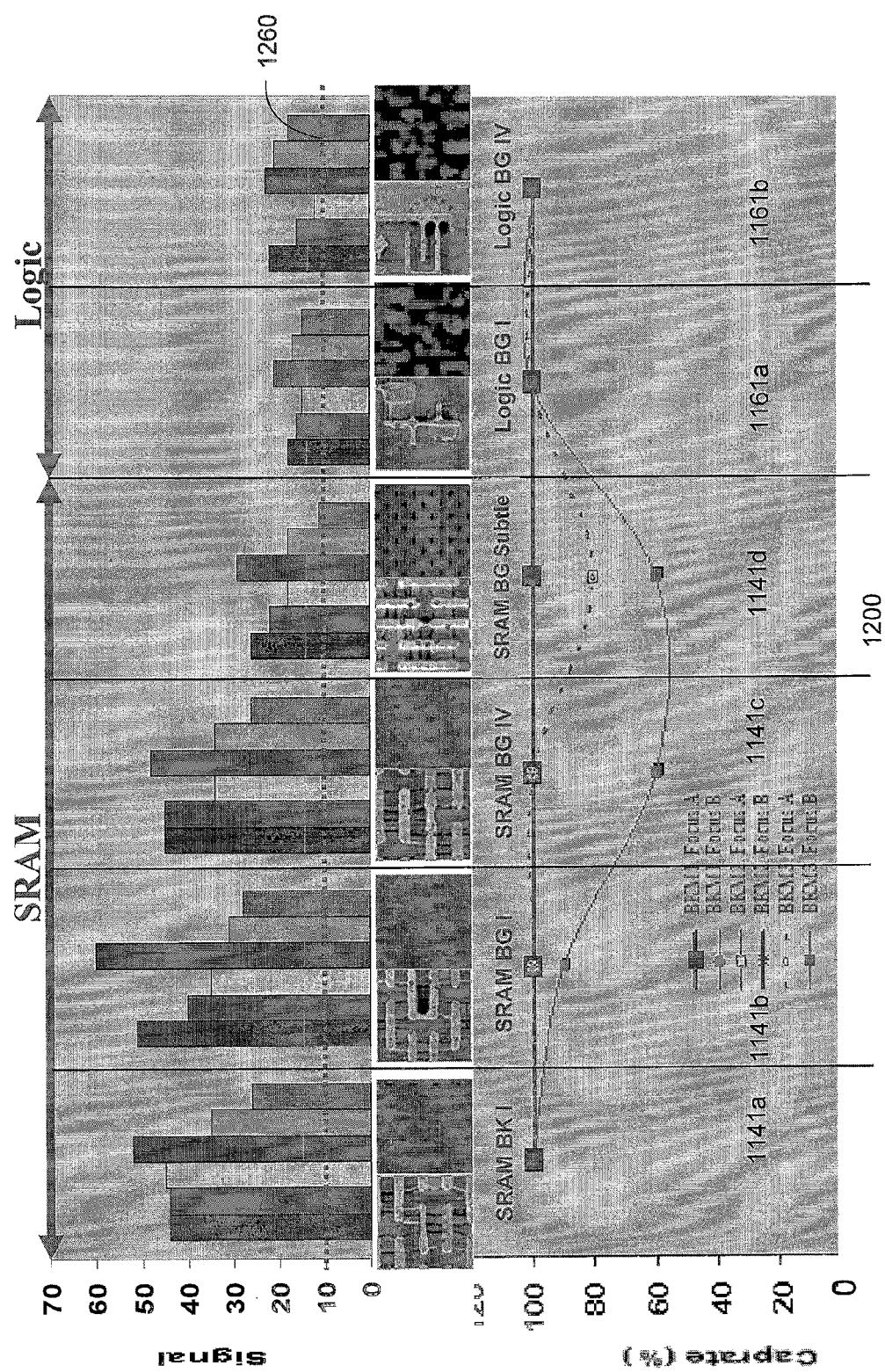
FIG. 12 shows an embodiment of a Signal/Noise analysis and capture rate study.

FIG. 12 shows an exemplary embodiment of a S/N analysis and capture rate study 1200. The study analyzes S/N responses of DOIs 1140a-d and 1160a-b, as described in FIG. 11. For each DOI, there are six modes. The recipes BKM1, BKM2 and BKM3 correspond to the recipes with highest S/N response averages in FIG. 11. The recipes include two variations, one with focus A and one with focus B. Providing a study which analyzes other types of DOIs or recipes may also be useful.

A threshold 1260 is defined based on the S/N responses of the different types of DOIs. The threshold should be set to detect the S/N responses. S/N responses having a level below the threshold will not be detected. Preferably, the threshold is set low while still detecting the S/N responses.

Defect capture rates of the DOIs for the different modes are plotted. The defect capture rate is calculated by taking the total number of PDs detected by the inspection divided by the total number of PDs available, for example, of an inspected die.

As shown, the capture rates for the first, second and fourth modes are about 100% for the different DOIs. The third and fifth modes exhibit good capture rates for DOIs except for the DOI type 1141d. The sixth mode exhibits the worst capture rate performance as compared to the other modes. The recipe with the best capture rate may be selected as the final BKM for use to inspect the corresponding layer of the DOIs. In the case where more than one recipe has similar or the same performance, more than one final BKMs may be selected.

Figure 13:
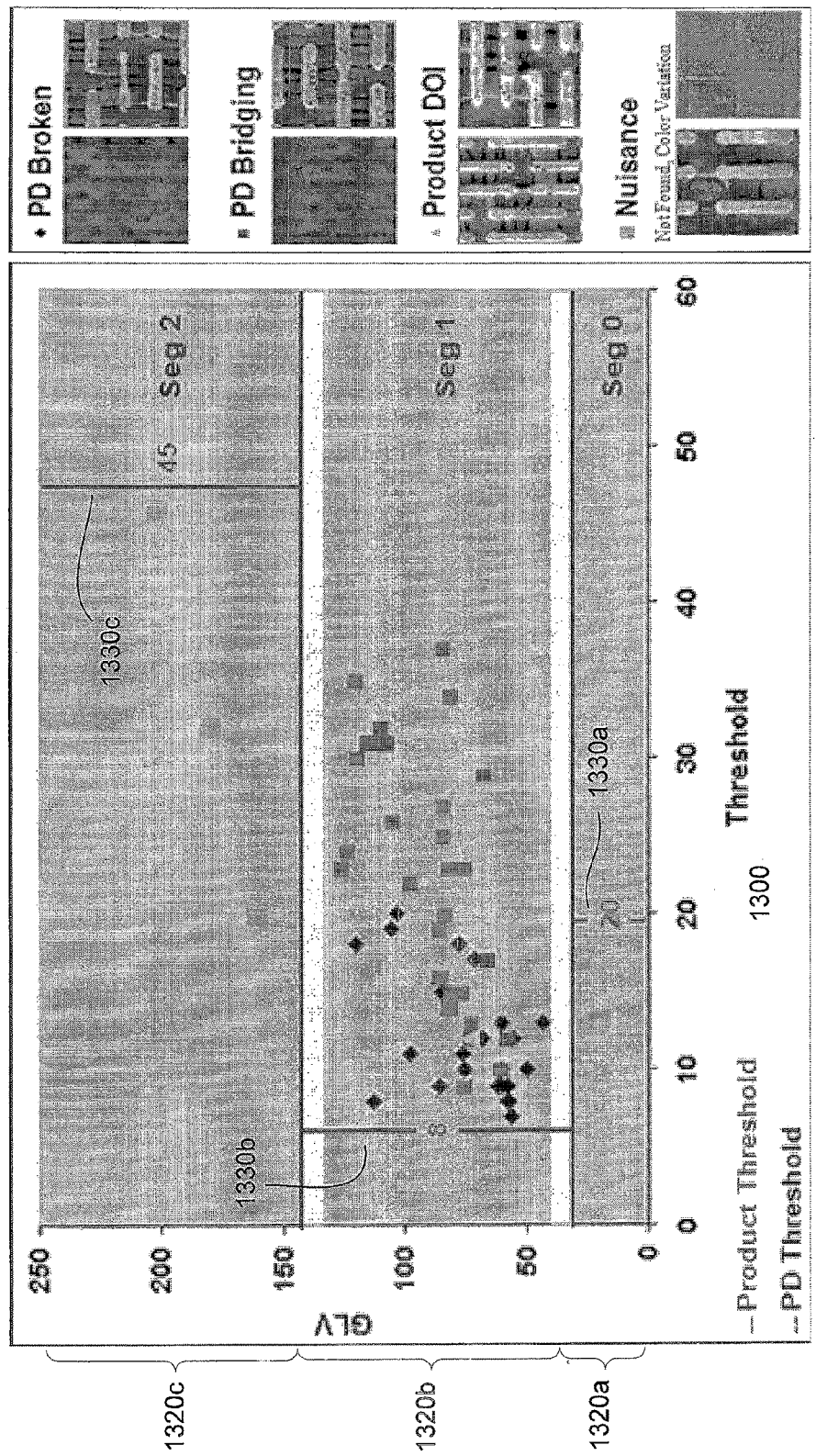
FIG. 13 shows an embodiment of threshold segmentation for an inspection recipe.

FIG. 13 illustrates an embodiment of threshold segmentation 1300 for an inspection recipe. The inspection recipe detects nuisance signals, defect signals of PDs and defect signals on the product (Product defects). The grey level voltage (GLV) of the signals is plotted. As can be seen, the GLV of Product and PD defect signals detected are between about 40-140 or within segment 1. Nuisance signals are detected in segment 0 and segment 2. The thresholds can be segmented. For example, different thresholds can be set for different segments. As shown, segment 1 has its threshold set at 8 to ensure detection of the PD and Product defects while the thresholds in segment 0 and segment 2 are set at 20 and 45, respectively, to avoid detecting nuisance signals. Thus, segmentation of threshold signals can be useful in filtering out nuisance signals.

Figure 14A:
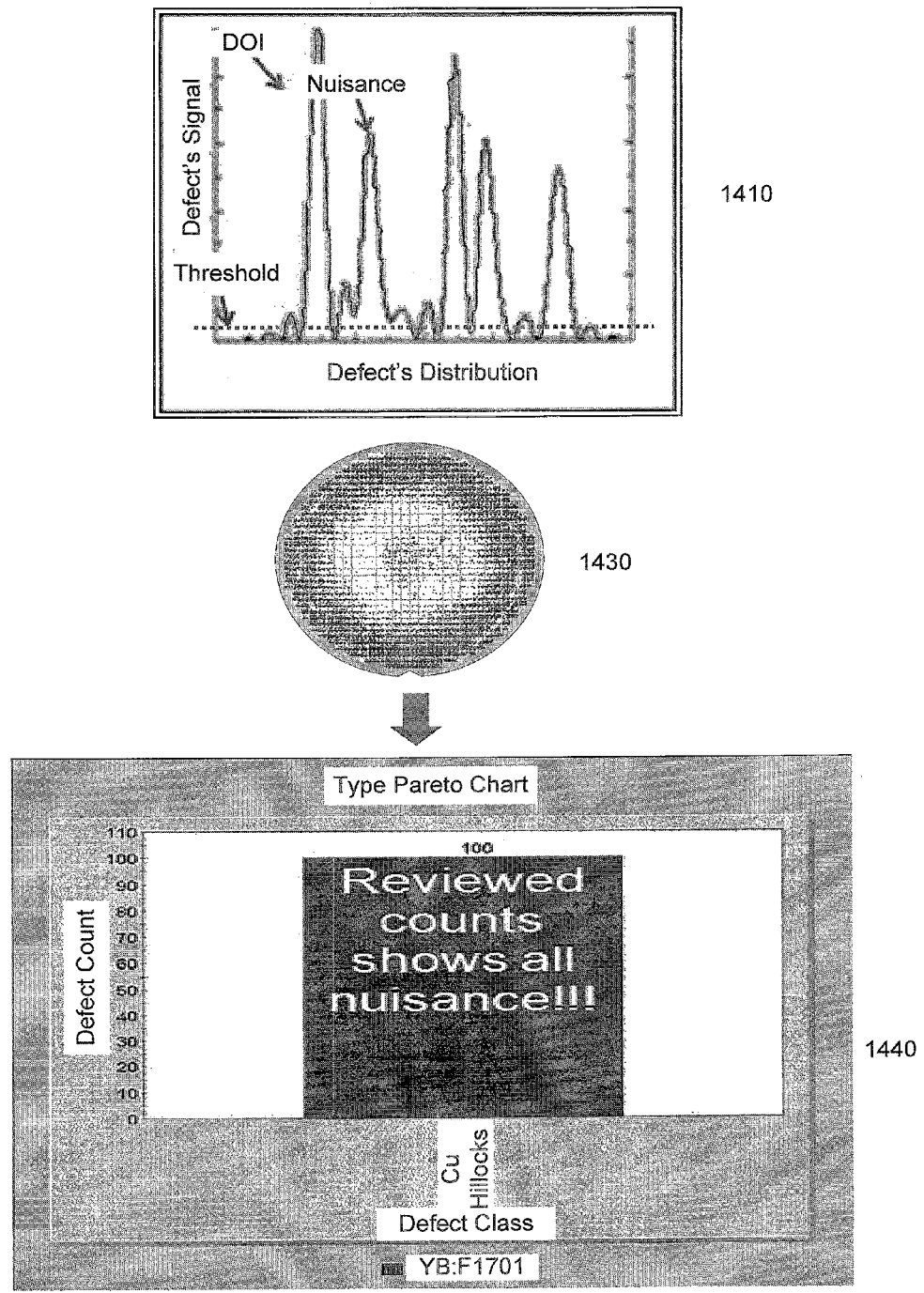
FIGS. 14a-b show exemplary results of defect detections using a non-PD recipe and PD recipe respectively.
Figure 14B:
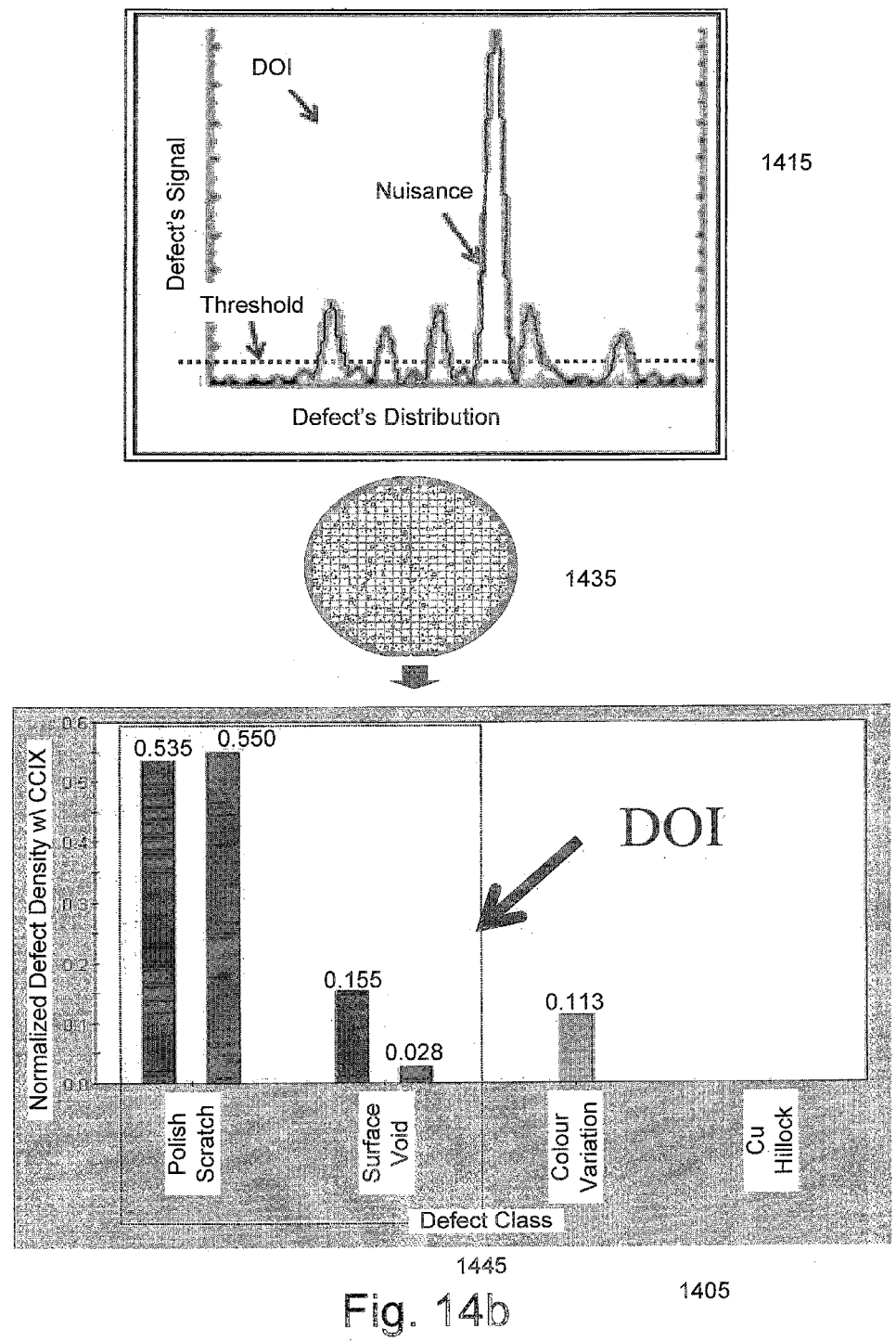

FIG. 14a illustrates exemplary results of defect detection using a recipe defined without the benefit of a program defect study (non-PD recipe); FIG. 14b illustrates exemplary results of defect detection using a recipe defined with the benefit of a program defect study (PD recipe). Referring to FIG. 14a, a signal chart 1410 of defect signals detected using a non-PD recipe in accordance to their distribution is shown. The defect signals of DOIs from scanning with a non-PD recipe are relatively low in magnitude as compared to the nuisance signals. To ensure that all DOIs are captured, a low threshold setting is used. However, the low threshold setting results in large number of defects detected, as indicated by gross wafer map 1430. This makes it difficult to identify real defects versus nuisance signals. For example, a defect count chart 1440 indicates that all defect signals correspond to nuisance.

Referring to FIG. 14b, defect signals detected using a PD recipe in accordance to their distribution are provided in a signal chart 1415. As shown, the scanning with the PD recipe enhances the magnitude of the defect signals of the DOIs as compared to those using a non-PD recipe. Furthermore, the PD recipe results in nuisance signals being weakened. Improved S/N response enables higher capture of DOIs, even when a low threshold is used. Defect signals are provided in a wafer map 1435. The defect count chart 1445 shows that a high percentage of the defects are DOIs and not nuisance signals. As such, suppressing nuisance signals using a PD recipe study can significantly increase the probability that real defects are captured.

Figure 15:
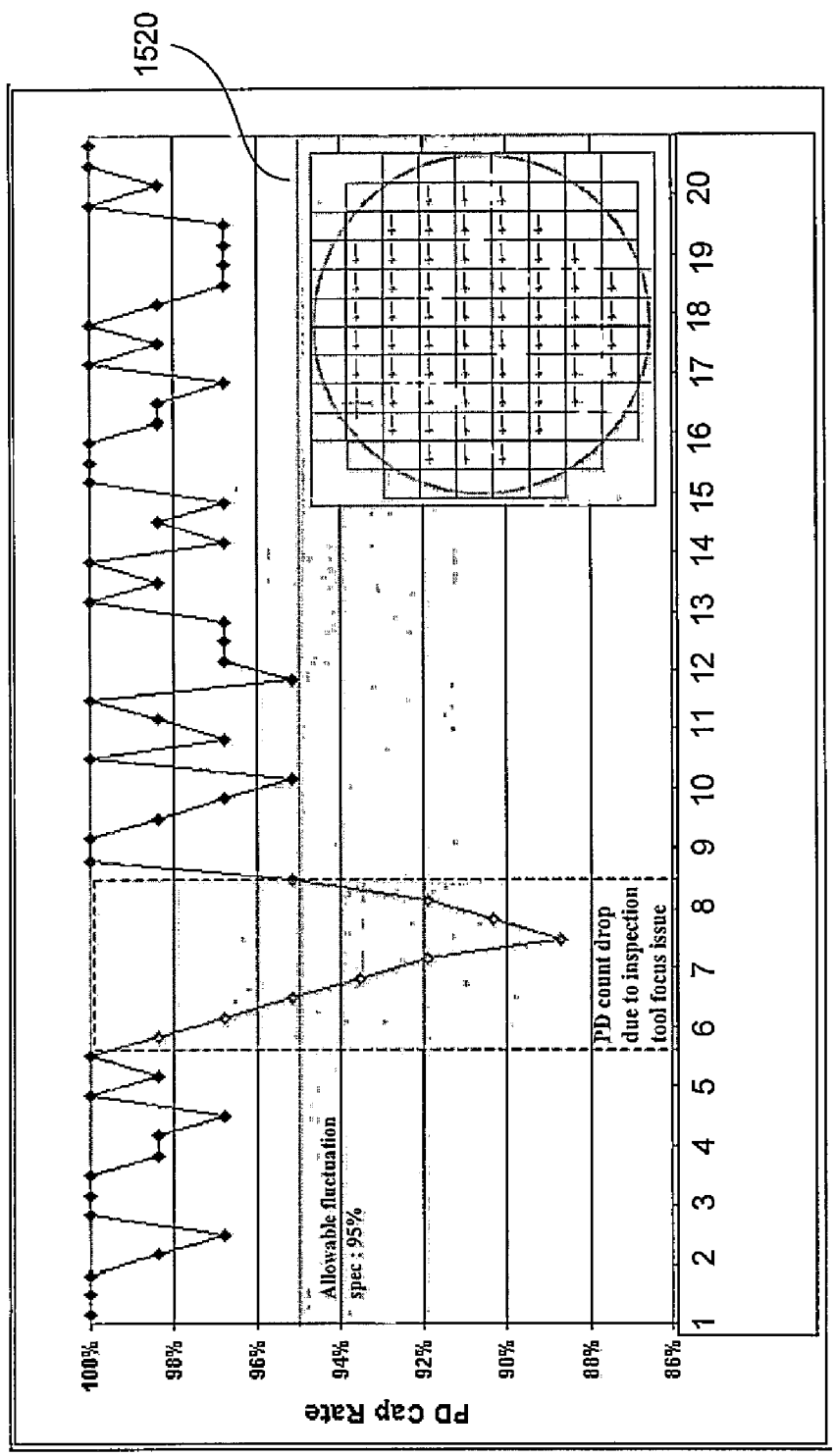
FIG. 15 shows a plot of capture rates using a PD recipe over time.

In other embodiments, PD test chiplets may also be employed to monitor the stability of the inspection recipe and health of the defect detection tool. FIG. 15 plots the capture rate of defects using a PD recipe over time. As shown, defects from 20 time periods were analyzed. In one embodiment, each time period is 3 days apart. A specified threshold 1520 may be set to determine when a capture rate is below an acceptable range. For example, the specified threshold may be set at 95% capture rate. Other specified threshold values may also be useful.

As shown from the plot, the capture rate of the inspection tool using the PD recipe dropped below the acceptable level. This may indicate that the inspection tool may need to be examined to determine whether there are any problems or process changes which have caused the capture rate to drop. For example, process changes may affect PD patterns and capture rates.

As described, PD test chiplets are employed during processing of devices. The PDs are printed on the wafers at known fixed locations. The use of PDs facilitates creation of a final BKM which is effective in detecting real defects while suppressing noise. Furthermore, it also facilitates checking on the stability of the final BKM over time. The use of PDs also facilitates monitoring the health of the inspection tools as well as process changes.

Figure 16:
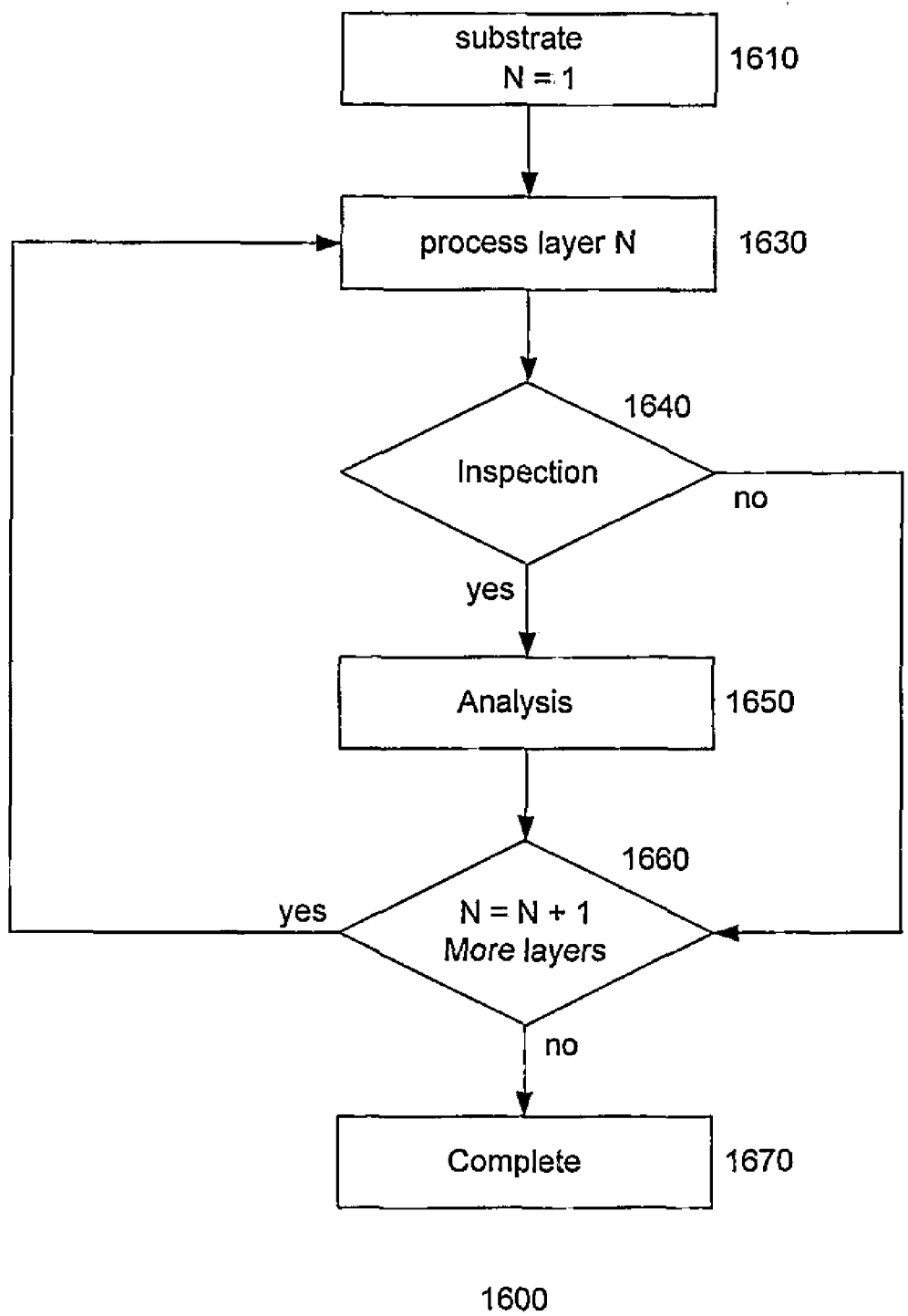
FIG. 16 shows an embodiment of a process for forming devices.

FIG. 16 shows an embodiment of a process 1600 for forming devices. A substrate is provided at step 1610. The substrate may be, for example, a semiconductor substrate such as a silicon wafer. Other types of substrates or wafers are also useful. The wafer is used to form a plurality of devices or dies in parallel. The substrate is ready for processing the first layer (e.g., N=1).

At step 1630, the $N^{th}$ layer of the substrate is processed. For example, in the case where N=1, the active layer of the substrate is processed. The features of the substrate are patterned into the $N^{th}$ layer of the substrate. Patterning comprises, for example, masking and etching the $N^{th}$ layer of the substrate. Other techniques for forming features of the $N^{th}$ layer are also useful.

After processing the $N^{th}$ layer, inspection on the processed layer may be performed at step 1640. If no inspection is performed, the process continues to step 1660. The inspection is performed with an inspection tool programmed with a BKM recipe determined through a PD study. For example, the various parameters of the BKM recipe are determined as described in FIG. 10a and FIGS. 11-13. The results of the inspection may be analyzed at step 1650. It is understood that the analysis may be performed in line, off line or a combination thereof. After the analysis, the process continues to step 1660.

At step 1660, the process determines if there are anymore layers to be processed. For example, if the $N^{th}$ layer is the last layer of the devices, then the processing is completed. The process then proceeds to step 1670. If there are more layers to be processed, the process returns to step 1630 to process the next layer (e.g., N=N+1). Steps 1630 to 1660 are repeated until all layers of the devices are processed.

As described, PD test chiplets are employed during processing of devices. The PDs are printed on the wafers at known fixed locations. The use of PDs facilitates creation of a final BKM efficiently (time and manpower) and it is effective in detecting real defects while suppressing noises. Furthermore, it also facilitates checking on the stability of the final BKM over time. The use of PDs also facilitates monitoring the health of the inspection tools as well as process changes.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate;
   processing a layer of the device on the substrate; and
   inspecting the layer with an inspection tool for defects, wherein the inspection tool is programmed with an inspection recipe determined from a programmed defects study; and
   wherein the programmed defects study comprises
      providing a test chiplet with defects programmed therein at known locations of the substrate,
      inspecting the substrate with a group of initial defect detection recipes,
      analyzing signal-to-noise responses of the initial defect detection recipes, and
      selecting the detection recipe with the best signal-to-noise response which gives the highest capture rate of the programmed defects as the inspection recipe.

2. The method of claim 1 wherein:
   the device comprises a plurality of layers; and
   processing a layer and inspecting the layer are repeated until all layers of the device are processed on the substrate.

3. The method of claim 2 wherein the defects are programmed into at least one of the layers of the device at known locations.

4. The method of claim 2 wherein the defects are programmed into some of or all of the layers of the device at known locations.

5. The method of claim 1 wherein:
   the device comprises a plurality of layers; and
   processing a layer of the device is repeated until all layers of the device are processed.

6. The method of claim 5 wherein the defects are programmed into at least one of the layers of the device at known locations.

7. The method of claim 6 wherein inspecting the layer is performed after the layer with programmed defects is processed.

8. The method of claim 5 wherein the defects are programmed into some of or all of the layers of the device at known locations.

9. The method of claim 8 wherein inspecting the layer is performed after the layer with programmed defects is processed.

10. The method of claim 1 wherein the test chiplet comprises a plurality of test cells.

11. The method of claim 10 wherein the defects comprise bridging defects, necking defects or a combination thereof.

12. The method of claim 11 wherein the defects comprise subtle defects.

13. The method of claim 10 wherein:
   the test chiplet is disposed in a scribe region surrounding the device or an inactive region within the device; or
   a first test chiplet is disposed in the scribe region and a second test chiplet is disposed within the device.

14. The method of claim 13 wherein the defects comprise bridging defects, necking defects or a combination thereof.

15. The method of claim 14 wherein the defects comprise subtle defects.

16. A method of defect inspection comprising:
   providing a substrate;
   inspecting the layer with an inspection tool for defects, wherein the inspection tool is programmed with an inspection recipe determined from a programmed defects study; and
   wherein the programmed defects study comprises
      providing a test chiplet with defects programmed therein at known locations of the substrate,
      inspecting the substrate with a group of initial defect detection recipes,
      analyzing signal-to-noise responses of the initial defect detection recipes, and
      selecting the detection recipe with the best signal-to-noise response which gives the highest capture rate of the programmed defects as the inspection recipe.

17. The method of claim 16 wherein the test chiplet comprises a plurality of test cells.

18. An inspection tool comprising:

a recipe set up menu; and an inspection recipe stored in the inspection tool, the inspection recipe is used to inspect a layer of a device, the inspection recipe is defined through a programmed defects study, wherein the programmed defects study comprises providing a test chiplet with defects programmed therein at known locations of the substrate, inspecting the substrate with a group of initial defect detection recipes, analyzing signal-to-noise responses of the initial defect detection recipes, and selecting the detection recipe with the best signal-to-noise response which gives the highest capture rate of the programmed defects as the inspection recipe.

19. The inspection tool of claim 18 comprises an optical inspection tool or an ebeam inspection tool.

* * * * *